United States Patent
Sönning et al.

(10) Patent No.: US 7,127,004 B1
(45) Date of Patent: Oct. 24, 2006

(54) INTERLEAVER AND METHOD FOR INTERLEAVING AN INPUT DATA BIT SEQUENCE USING A CODED STORING OF SYMBOL AND ADDITIONAL INFORMATION

(75) Inventors: Raimund Sönning, Rathsbergstrasse (DE); Gian Huaman-Bollo, Avenariusstrasse (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 299 days.

(21) Appl. No.: 09/667,528

(22) Filed: Sep. 22, 2000

(30) Foreign Application Priority Data

Sep. 28, 1999 (EP) .................................. 99119009

(51) Int. Cl.
*H04L 27/04* (2006.01)
(52) U.S. Cl. ...................................... 375/295
(58) Field of Classification Search ................ 375/341, 375/265, 372, 219, 220, 221, 222, 262, 295, 375/260; 714/759, 763, 768, 794, 795, 769, 714/718, 719, 755, 796, 701; 380/28
See application file for complete search history.

(56) References Cited

U.S. PATENT DOCUMENTS

| | | | | |
|---|---|---|---|---|
| 4,198,619 A * | 4/1980 | Atalla | .......................... | 340/149 |
| 5,463,641 A * | 10/1995 | Dorward et al. | ............. | 714/755 |
| 5,506,866 A * | 4/1996 | Bremer et al. | ............... | 375/216 |
| 5,594,797 A * | 1/1997 | Alan ar a et al. | ............. | 380/28 |
| 5,673,291 A | 9/1997 | Dent | | |
| 5,815,514 A * | 9/1998 | Gray | .......................... | 714/775 |
| 5,892,464 A * | 4/1999 | St. John et al. | ............. | 714/786 |
| 5,907,566 A * | 5/1999 | Benson et al. | ............... | 714/798 |
| 5,983,383 A * | 11/1999 | Wolf | .......................... | 714/755 |
| 6,182,265 B1 * | 1/2001 | Lim et al. | ................... | 714/786 |
| 6,385,752 B1 * | 5/2002 | Li | .............................. | 714/790 |
| 6,507,629 B1 * | 1/2003 | Hatakeyama | ............... | 375/372 |
| 6,553,538 B1 * | 4/2003 | Zehavi | ....................... | 714/784 |
| 6,597,526 B1 * | 7/2003 | Gray | .......................... | 360/40 |
| 2002/0053049 A1 * | 5/2002 | Shiomoto et al. | ........... | 714/701 |

FOREIGN PATENT DOCUMENTS

| | | |
|---|---|---|
| DE | 42 19 400 A1 | 12/1993 |
| EP | 0 608 079 A2 | 7/1994 |
| WO | 93/14588 | 7/1993 |
| WO | 93/15502 | 8/1998 |

* cited by examiner

*Primary Examiner*—Emmanuel Bayard
(74) *Attorney, Agent, or Firm*—Nixon & Vanderhye, P.C.

(57) ABSTRACT

The invention relates to a method for storing code symbols and additional control information in a processing means of an encoder of a communication system. In particular, the invention relates to the storing of code symbols together with additional control information in an interleaving memory (IM) of an interleaver. According to the invention, a combining means (COM) combines respective data bits (I, Q) forming a respective code symbol with their associated control bits into a control information/code symbol data word of a predetermined number (K) of bits. A control information/code symbol encoding means (CI/CS-ENC) encodes the control information/code symbol data words into encoded data words of a smaller number of bits. This data word with a smaller number of bits is then stored at a particular memory location in the interleaving memory (IM).

34 Claims, 13 Drawing Sheets

FIG.4 PRIOR ART

ADDRESSING ↓

| DATA BITS | | CONTROL BITS | | | |
|---|---|---|---|---|---|
| 0 | 1 | 0 | 0 | 0 | 0 |
|   |   |   |   |   |   |
| 0 | 1 | 0 | 0 | 0 | 1 |
|   |   |   |   |   |   |
| 0 | 0 | 1 | 0 | 0 | 1 |

— RAM

1 SYMBOL PER ROW

PRETERMINED WIDTH

FIG.7

ADDRESSING ↓

POSSIBLE CASES: $2^{WIDTH}$

| DATA BITS | & | CONTROL BITS | | FUNCTION |
|---|---|---|---|---|
| 0 | 1 | 0 | 0 | STOP |
|   |   | 0 | 0 | START |
|   |   | 0 | 0 | NORMAL |
|   |   | 0 | 1 |   |
|   |   |   |   |   |

— RAM

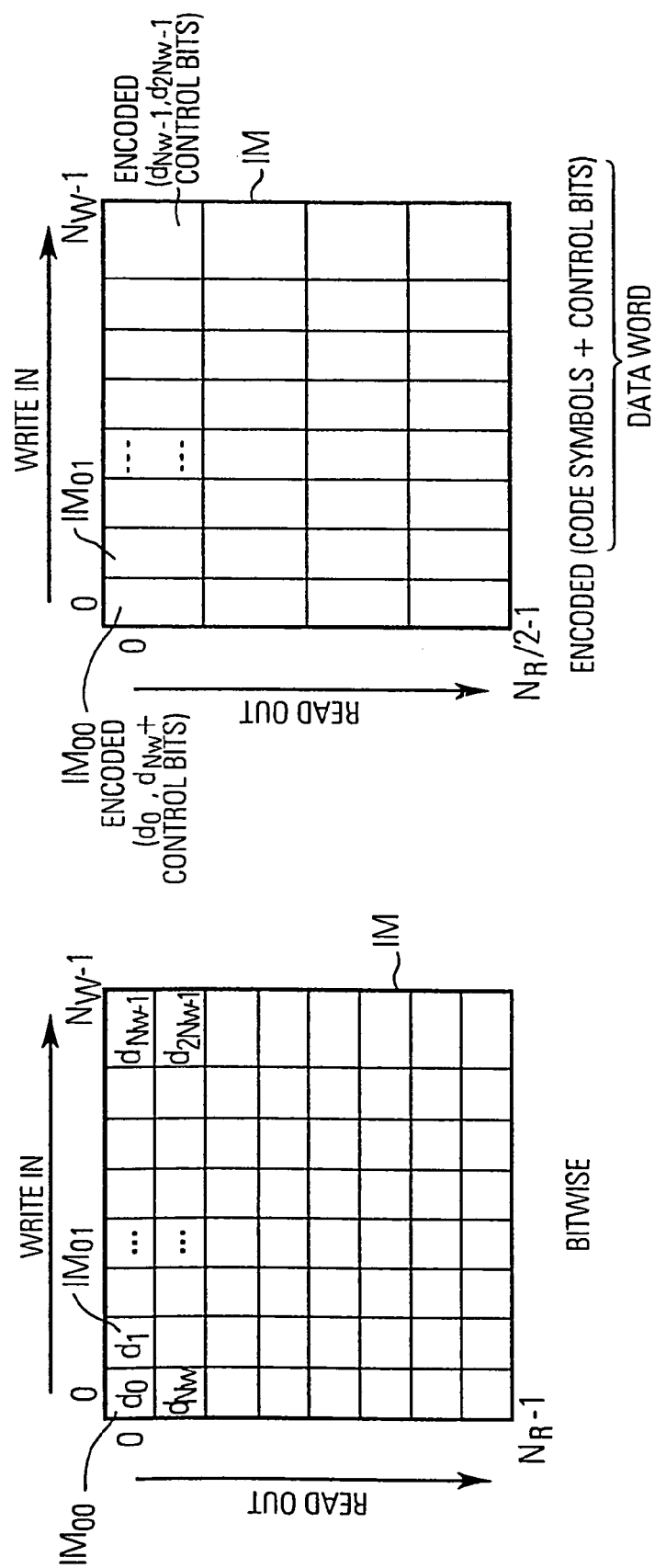

FIG. 8

| FS | SS | MA | PW | Q | I | ENCODED DATA VALUE(HEX) | FUNCTION |
|---|---|---|---|---|---|---|---|
| 0 | 0 | 0 | 0 | X | X | C | POWER OFF |
| 0 | 0 | 0 | 1 | 0 | 0 | 0 | NORMAL TRANSMISSION, I=0, Q=0 |
| 0 | 0 | 0 | 1 | 0 | 1 | 1 | NORMAL TRANSMISSION, I=1, Q=0 |
| 0 | 0 | 0 | 1 | 1 | 0 | 2 | NORMAL TRANSMISSION, I=0, Q=1 |
| 0 | 0 | 0 | 1 | 1 | 1 | 3 | NORMAL TRANSMISSION, I=1, Q=1 |
| 0 | 1 | 0 | 0 | X | X | D | SLOT START, POWER OFF |
| 0 | 1 | 0 | 1 | 0 | 0 | 4 | SLOT START, I=0, Q=0 |
| 0 | 1 | 0 | 1 | 0 | 1 | 5 | SLOT START, I=1, Q=0 |
| 0 | 1 | 0 | 1 | 1 | 0 | 6 | SLOT START, I=0, Q=1 |
| 0 | 1 | 0 | 1 | 1 | 1 | 7 | SLOT START, I=1, Q=1 |
| 1 | X | 0 | 0 | X | X | E | FRAME START, POWER OFF |
| 1 | X | 0 | 0 | 0 | 0 | 8 | FRAME START, I=0, Q=0 |
| 1 | X | 0 | 0 | 0 | 1 | 9 | FRAME START, I=1, Q=0 |
| 1 | X | 0 | 0 | 1 | 0 | A | FRAME START, I=0, Q=1 |
| 1 | X | 0 | 0 | 1 | 1 | B | FRAME START, I=1, Q=1 |
| X | X | 1 | 1 | X | X | F | MARKER FOR SPECIAL SYMBOL |

TABLE 1: DATA ENCODING IN EXTERNAL RAM
(FS = FRAME START, SS = SLOT START, MA = MARKER, PW = POWER, X = DON'T CARE)

FIG. 9

| FUNCTION | ENCODED DATA VALUE(HEX) | FS | SS | MA | PW | Q | I |
|---|---|---|---|---|---|---|---|
| NORMAL TRANSMISSION, I=0, Q=0 | 0 | 0 | 0 | 0 | 1 | 0 | 0 |
| NORMAL TRANSMISSION, I=1, Q=0 | 1 | 0 | 0 | 0 | 1 | 0 | 1 |
| NORMAL TRANSMISSION, I=0, Q=1 | 2 | 0 | 0 | 0 | 1 | 1 | 0 |
| NORMAL TRANSMISSION, I=1, Q=1 | 3 | 0 | 0 | 0 | 1 | 1 | 1 |
| SLOT START, I=0, Q=0 | 4 | 0 | 1 | 0 | 1 | 0 | 0 |
| SLOT START, I=1, Q=0 | 5 | 0 | 1 | 0 | 1 | 0 | 1 |
| SLOT START, I=0, Q=1 | 6 | 0 | 1 | 0 | 1 | 1 | 0 |
| SLOT START, I=0, Q=0 | 7 | 0 | 1 | 0 | 1 | 1 | 1 |
| FRAME START, I=0, Q=0 | 8 | 1 | 1 | 0 | 1 | 0 | 0 |
| FRAME START, I=1, Q=0 | 9 | 1 | 1 | 0 | 1 | 0 | 1 |
| FRAME START, I=0, Q=1 | A | 1 | 1 | 0 | 1 | 1 | 0 |
| FRAME START, I=1, Q=1 | B | 1 | 1 | 0 | 1 | 1 | 1 |
| POWER OFF | C | 0 | 0 | 0 | 0 | 0 | 0 |
| SLOT START, POWER OFF | D | 0 | 1 | 0 | 0 | 0 | 0 |
| FRAME START, POWER OFF | E | 1 | 1 | 0 | 0 | 0 | 0 |
| MARKER FOR SPECIAL SYMBOL | F | 0 | 0 | 1 | 1 | 1 | 1 |

TABLE 2: DATA DECODING $$n_W + (n_R + n-1)N_W + n_R N_W (N-1) = m$$

FIG. 11a
ONLY CODE SYMBOLS ARE SHOWN

|  | $n_W$ | $N = 2$ (QPSK) | | | $N_W = 4$ |
|---|---|---|---|---|---|
|  | 0 | 1 | 2 | 3 | |
| $n_R = 0$ | [0] | 1 | 2 | 3 | $n = 1$ |
|  | [4] | 5 | 6 | (7) | $n = 2$ |
| $n_R = 1$ | 8 | [9] | 10 | 11 | $n = 1$ |
|  | 12 | [13] | 14 | 15 | $n = 2$ |
| $n_R = 2$ | 16 | 17 | 18 | 19 | $n = 1$ |
|  | 20 | 21 | 22 | 23 | $n = 2$ |
| $n_R = 3$ | 24 | 25 | 26 | 27 | $n = 1$ |
|  | 28 | 29 | 30 | 31 | $n = 2$ |
| $n_R = 4$ | 32 | 33 | 34 | 35 | $n = 1$ |
|  | 36 | 37 | 38 | 39 | $n = 2$ |
|  | 40 | 41 | 42 | 43 | |

BIT POSITION m IN INPUT DATA BIT SEQUENCE

FIG. 11b
ONLY CODE SYMBOLS ARE SHOWN

|  | $n_W$ | $N = 4$ (e.g. 16 QAM) | | | $N_W = 4$ |
|---|---|---|---|---|---|
|  | 0 | 1 | 2 | 3 | |
| $n_R = 0$ | [0] | 1 | 2 | 3 | $n = 1$ |
|  | [4] | 5 | 6 | 7 | $n = 2$ |
|  | [8] | 9 | 10 | 11 | $n = 3$ |
|  | [12] | 13 | 14 | 15 | $n = 4$ |
| $n_R = 1$ | 16 | 17 | 18 | 19 | $n = 1$ |
|  | 20 | 21 | 22 | 23 | $n = 2$ |
|  | 24 | 25 | 26 | 27 | $n = 3$ |
|  | 28 | 29 | 30 | 31 | $n = 4$ |
| $n_R = 2$ | 32 | 33 | 34 | 35 | $n = 1$ |
|  | 36 | 37 | 38 | 39 | $n = 2$ |
|  | 40 | 41 | 42 | 43 | $n = 3$ |

FIG.11c

ONLY CODE SYMBOLS ARE SHOWN $$N = 2 \; ; \; N_W = 7$$

| $n_W$ | 0 | 1 | 2 | 3 | 4 | 5 | 6 |
|---|---|---|---|---|---|---|---|
| $n_R = 0$ | 0 | 1 | 2 | 3 | 4 | 5 | 6 |
|  | 7 | 8 | 9 | 10 | 11 | 12 | 13 |
| $n_R = 1$ | 14 | 15 | 16 | 17 | 18 | 19 | 20 |
|  | 21 | 22 | 23 | 24 | 25 | 26 | 27 |

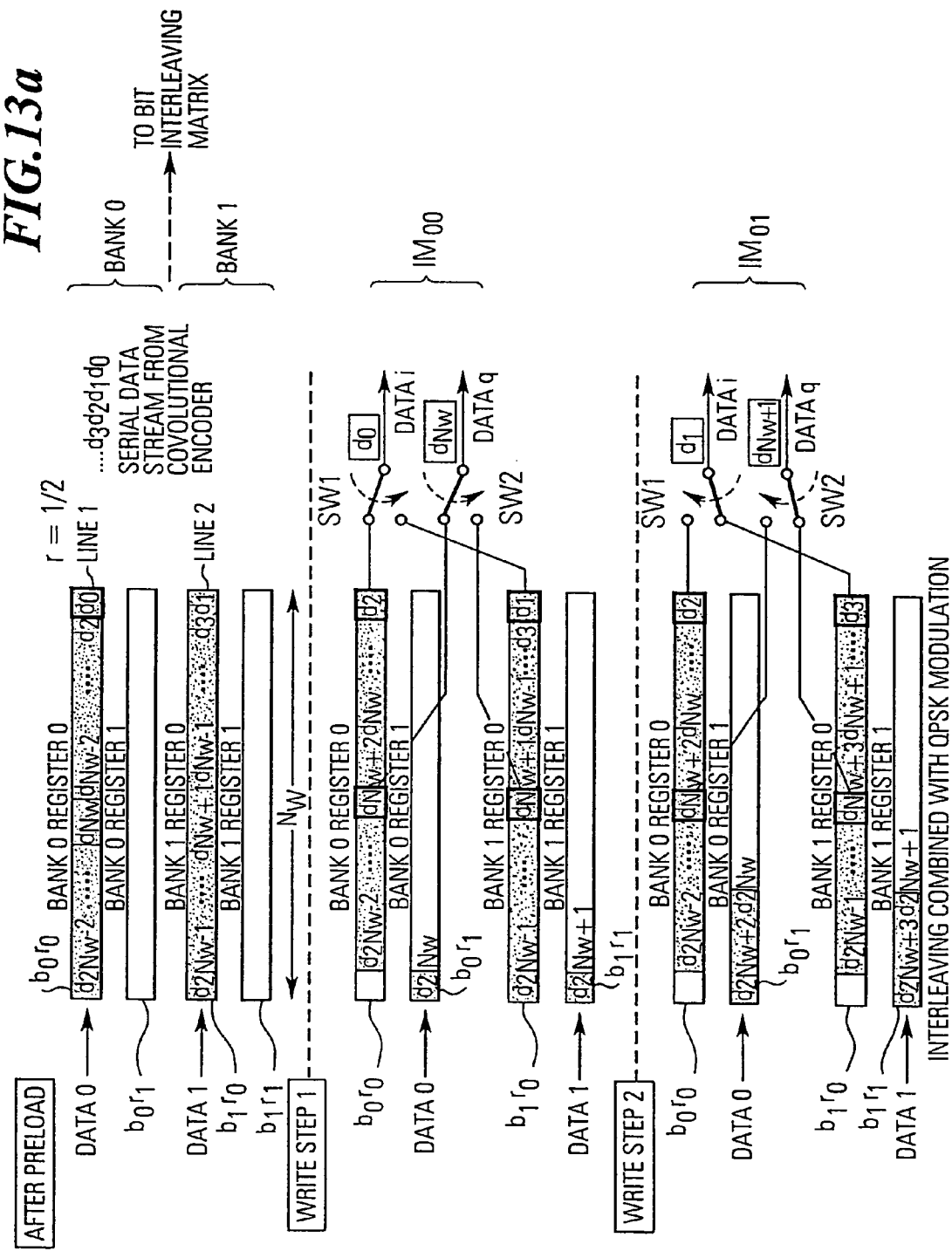

INTERLEAVER AND METHOD FOR INTERLEAVING AN INPUT DATA BIT SEQUENCE USING A CODED STORING OF SYMBOL AND ADDITIONAL INFORMATION

FIELD OF THE INVENTION

The invention relates to an interleaver for interleaving input data bit sequences of data bits of code symbols each consisting of a number of data bits together with additional information, in particular control information, consisting of a number of control bits which indicate control functions for each code symbol. The invention also relates to a method for interleaving such a data bit sequence. Furthermore, the invention relates to a transmitter where code symbols are processed together with control information.

Thus, generally the invention relates to the processing of data symbols together with additional control information. Whilst the storage of the data information together with the control information is comparatively simple when only one user channel is considered, storage problems in the transmitter become quite severe when a great plurality of user channels (providing data information in terms of bits) are to be combined with control information and are to be stored before transmission.

BACKGROUND OF THE INVENTION

The fact, that data information must be combined with control information before transmission is a common aspect relating generally to telecommunication systems. In particular, this problem becomes severe, when a great plurality of user channels needs to be processed as it is the case in a CDMA system. A base transceiver station BTS of a CDMA system, to which the invention is applicable, is generally shown in FIG. 1.

Briefly summarized, the block diagram in FIG. 1 shows a base transceiver station BTS of a CDMA-system comprising a baseband transmitter TX, a baseband receiver RX and a HF section. In the transmitter TX, user data, for example in the form of ATM packets, is input into a channel encoder unit ENC via an ATM switch and a corresponding interface ATM IFX/IFC. The coded (and also interleaved) data is then modulated and spreaded by a baseband transmitter unit BBTX. The modulated data is then filtered and converted to an analog signal in the unit TRX-DIG, upconverted to the desired carrier frequency in the unit TRX-RF, amplified by a power amplifier unit MCPA and finally transmitted to an antenna ANT via a duplex filter.

In the receiving part of the HF section, two antennas (diversity reception) are commonly used in each sector to receive the signal which is then amplified in the unit LNA, downconverted in the unit TRX-RF, A/D converted and filtered in the unit TRX-DIG. Then the data is demodulated by a RAKE receiver/despreader in the receiver unit BBRX while random access channels (branched off by an intermediate filter unit BBIF) are detected and demodulated in the unit BBRA. The user data US are then decoded in the decoder unit DEC and transmitted to the ATM switch via an ATM interface ATM IFX/IFC.

In the CDMA base transceiver station BTS a bit-interleaving and de-interleaving is respectively performed in the encoder ENC in the baseband transmitter TX and the decoder DEC in the baseband receiver RX.

FIG. 2 shows a functional overview of the encoder ENC, where a plurality of data of individual user channels US1, US2, US3 are input as sequential packets including respective data bit sequences at ②  into the ATM interface field programmable gate array FPGA ATM-IN. Upon channel coding in the FPGA CCOD-TCH interleaving is performed in the FPGA INTER-MOD at ③. That is, in FIG. 2 a number $N_{USCH}$ of user channels (e.g. up to 300 different channels) input user data US at ② while control information CI for controlling the transmission of said data bit sequences is input at the digital signal processor DSP ① or generally by the FPGA INTER-MOD ③. The data bits plus their associated control information are interleaved and time-aligned in the FPGA modulator FPGA INTERMOD ③ using a memory arrangement of 3 RAMs shown at ④ and the interface FPGA RAM-IF1. The interleaved and time-aligned data is then transmitted to the baseband transmitter unit BBTX via the FPGA BBTX-OUT ⑤.

Thus, in addition to channel encoding and interleaving the encoder ENC in FIG. 2 combines data symbols from the user channels US1, US2, US3 . . . and control information CI, whereafter the combined information is provided to the baseband transmitter unit BBTX.

Data bits are provided in the form of code symbols representing one element of an alphabet of a digital modulation scheme such as QPSK or 16QAM. The control information associated with every code symbol is used to control other processing parts within the baseband transmitter unit BBTX. In general the BBTX unit spreads each code symbol to the common chip rate and performs a multiplication with the CDMA code and a weighting with a specific transmission power.

Furthermore, in such a transmitter, the data information of the user channel may be transmitted in individual frames. When several user channels are present, as is the case normally for example in a mobile radio communication system, then several user channels each provide digital data information which is to be inserted into the specific frames on the radio link between the transmitter of the base stations and the mobile stations. Each data frame may comprise data packets of several user channels which may arrive sequentially. Each packet is separately encoded and interleaved, before code symbols are formed and provided in parallel for all user channels to the CDMA modulator in the unit BBTX. The parallel processing towards the CDMA modulator is necessary because of the CDMA technique where all channels are added up prior to transmission.

Each packet thus contains a data bit sequence of a predetermined number of data bits (e.g. $M_i$ bits) belonging to one user channel. The individual code symbols formed from the input data bit sequence in each packet may consist of e.g.

N=2 data bits representing the 4 possible states of a QPSK modulation (i.e. an I bit and a Q bit) and the control information CI may consist of e.g. L=4 control bits indicating specific control functions with respect to the corresponding code symbols.

As described above, in FIG. 2 a plurality of data of individual user channels US1, US2, US3, . . . are input as sequential packets comprising respective data bit sequences at ②. An interleaving is then performed in the FPGA INTER-MOD ③ and the memory arrangement ④. In addition, control information CI is input to the DSP ①. Alternatively, the DSP ① or even the FPGA ③ themselves may generate the control information CI. The control information is combined with the data bits, interleaved and time-aligned also in the FPGA ③ together with the memory arrangement of the 3 RAMs shown at ④. The data bits in form of code symbols (representing one state of a digital modulation scheme) together with the associated control information is then transmitted to the baseband transmitter unit BBTX via the FPGA BBTX-OUT ⑤.

Although FIGS. 1, 2 show a special structure of a CDMA transmitter, generally, a digital transmitter using a frame-wise processing of data packets can be summarized as shown in FIG. 3. That is, a data source DS, provides digital data US in form of packets to a channel encoder CC. The channel encoder CC may be a convolutional encoder, however, also other codes may be used, e.g. block codes, turbo codes, etc. If the coder is a convolutional encoder it makes use of a specific rate and constraint length as predefined by the encoder polynomial. For example, the channel encoder ENC in FIGS. 1, 2 uses a convolutional coder with a rate $r=1/2$ and a constraint length $c=9$.

The channel encoded digital data output by the channel encoder CC are again data packets comprising a data bit sequence BS containing $M_i$ data bits.

From the individual data bits of the data bit sequence code symbols each consisting of a number N of data bits are formed depending on the used digital modulation scheme. A write/read means W/R contains a selection means SM for extracting or selecting from the input data bit sequence BS data bits, which respectively belong to each other for forming such code symbols.

In a combining means COM the code symbols are combined with their corresponding control information CI (see for example FIG. 4). Then, the control information and the code symbols are provided as data bit sequence to an interleaver comprising an interleaving memory IM for performing the interleaving. Interleaving is an essential processing step in a mobile communication system to compensate errors introduced by flat fading more easily.

The write/read means W/R comprises a write means WM which writes the code symbols combined with the control information into the memory locations of the interleaving memory and a read means RM which reads out the stored information according to the interleaving scheme. The interleaved digital data sequence BS' consisting of a specific number of code symbols $M_i/N$ is output to the digital modulator MOD in the baseband transmitter unit BBTX which performs a modulation of the interleaved code symbols. For example, if the modulator uses a QPSK modulation, the bits are provided to the modulator as code symbols containing two bits, namely an I-bit and a Q-bit. The CDMA transmitter TX shown in FIG. 1 uses a QPSK modulation in the modulator BBTX. However, other digital modulation schemes can be used that require the provision of code symbols consisting of a different number of data bits. For example, a 16QAM method requires code symbols of four bits each and a 4QAM method requires code symbols of two bits each.

As is also seen in FIG. 3, the control information is read out together with the code symbols by the read means RM from the interleaving memory IM and is provided for example to the modulator MOD. For example, the control bits of the control information may indicate a frame start FS, a time slot start SS, a marker MA and/or a power bit PW for the respective code symbol. In particular, the power bit PW is an important control information used by the modulator MOD. Although FIG. 3 shows the provision of the control information to the modulator MOD only, this information can of course also be used in other units of the transmitter.

As described with respect to FIG. 3, the encoder ENC of the baseband transmitter TX comprises the channel coder CC, the combining means COM and a processing means formed by the interleaving memory IM and the write/read means W/R. However, having combined the control information and the code symbols in the combining means COM, a processing means may also take different forms depending on the specific processing desired in the transmitter for a specific modulation technique. However, conventionally the control information, i.e., the control bits, and the code symbols are processed separately in the processing means.

The invention should not be limited to the specific CDMA system or the transmitter shown in FIGS. 1, 2, 3, but any other processing scheme is applicable to the invention, as long as there is a need for processing the control information and code symbols, respectively data bits together.

Storage Problem of the Control Information and Code Symbols

In the course of the processing of the code symbols and the control bits in the processing means, there will always be the necessity to perform at least an intermediate storage of the information in a memory of the processing means, e.g. due to an interleaving process. Such a storage requirement may for example be satisfied by the interleaving memory IM.

Whilst the problem of how to store the data information together with the control information before transmission is thus a general problem that already occurs when considering only one user channel, of course, the problem becomes extremely severe when processing a great plurality of user channels (e.g. up to 300) as in FIGS. 1, 2, 3. The amount of data to be processed within each time interval of a frame (e.g. T=10 ms) gets very large. Therefore, the processing time and/or the memory requirements to perform channel encoding, bit-interleaving and time-alignment are very demanding.

FIG. 4 shows the conventional storage of data bits together with control bits in a memory, e.g. in the RAM memory shown in FIG. 2 or in the interleaving memory IM in FIG. 3. Such a combined storage is achieved by the conventional combining means COM as is shown in FIG. 3. The data bits and the associated control bits are listed in the rows, where each row is identified by an address. If data of a great plurality of user channels must be stored, preferably code symbols are formed before storing data to the RAM and the control bits are combined with such code symbols. This is possible as long as the control information is related to the code symbols finally transmitted over the air interface. Therefore, a set of two data bits in one row represents one code symbol of the data bit sequence which is to be transmitted.

As is shown in the example in FIG. 4, each data symbol (comprising two data bits) is used together with four control bits containing the control information and, if the memory positions only have a predetermined width of 4 bits, the complete information of 6 bits cannot be stored therein and thus the control information and the data symbols have to be stored in different memory locations (or different memories).

In addition, if the data symbols and a great variety of control information of many user channels has to be stored, a large memory, i.e., a large address space and many bits per address are necessary. Since it may be desired to store data symbols together with the control information for as many user channels as possible to keep RAM sizes and number of RAMs small, the memory should be configured such that as many memory positions as possible are available. For example, a 64 Kbit memory can be configured so as to have an address space of 16 kbit with a 4 bit width, while the same memory only has an address space of about 8 kbit with a bit width of 8. Thus, if data symbols of a specific length are to be stored together with a great variety of control information, obviously a large memory or more memories must be used or only a small number of user channels can be processed in a memory of a predetermined size.

FIG. 5 shows how conventionally each bit $d_0, d_1 \ldots$ of a code symbol etc. is stored at a separate memory location $IM_{00}$, $IM_{01}$ of an interleaving memory IM (or generally in a memory of a processing means). Already the separate storing of each individual bit of the data symbol thus requires a large memory. However, of course the situation becomes more severe, if also the control bits need to be stored in the interleaving memory together with the data bits. Furthermore, the large memory naturally increases the read/write access time to this memory as will be explained below. Moreover, if the control information (bits) belong to respective code symbols to be transmitted and each input data bit is stored separately, then the control information would have to be stored N-times (e.g. N=2 for QPSK).

Typical interleaving of an input data bit sequence BS comprising M data bits $d_0, d_1 \ldots d_{M-1}$ is shown in FIG. 5. FIG. 5 shows an interleaving matrix IM (i.e. in an interleaving memory) which is written row by row and read column by column for performing the interleaving of the data bits. Assuming that the input data bit sequence BS consists of M data bits and each bit is stored in its own memory location, then the interleaving matrix IM must have at least M memory locations $IM_{00}$, $IM_{01}$ etc. in an interleaver memory IM. The number of columns $N_W$ and the number of rows $N_R$ depends in fact on the interleaving depth which is here expressed as the number of columns before the writing of data bits jumps to the next row. The interleaving depth is always predetermined in an interleaver and if the interleaver depth is $N_W$, then the storage of M data bits requires $N_R = \lceil M/N_W \rceil$ rows.

Conventionally, as is shown in FIG. 5, each data bit $d_i$ of the input data bit sequence BS is stored at one memory location $IM_{nw,nr}$ defined by the respective row and column addresses $n_W = 0, 1, 2 \ldots N_W - 1$ and $nr = 0 \ldots, N_R - 1$. As explained above, the interleaving process itself consists of a write and read process to and from the interleaving matrix in FIG. 5. Each of the processes (writing or reading) for all channels must be accomplished within a frame period when processing is performed in a frame-wise manner, but both processes have to be fast enough to be able to handle the great number of data packets of all users in the system within one frame period, even if the number of user channels US is very large.

For example, in FIG. 5, all data bits of one packet are written row by row starting in row 0 and all output bits are read column by column starting in column 0. Assuming the dimension of the bit-interleaving matrices to be $M = N_R * N_W$ (number of rows*number of columns) the interleaving matrices must be filled completely by the data bit sequences contained in one frame in the predetermined time period of one frame. Afterwards the procedure is repeated in the next frame starting at rows 0 again. Therefore, in the aforementioned time interval of 10 ms each matrix has to be accessed (written or read) $N_R * N_W$ times. And as packets arrive sequentially this writing or reading is also done sequentially.

In the conventional method during reading, the read means RM outputs the data bits as code symbols as required by the digital modulation method to the modulator MOD. For example, the read means RM may combine the bits $d_0$ and $d_{N_W}$ after two read cycles by accessing the respective two separate memory locations thereof and then provide the bits as code symbol to the modulator MOD.

It will be appreciated that a considerable amount of time is used to read and write the data if the number of user channels is large since all interleaver matrices are accessed sequentially. The time for accessing the matrices as well as the storage requirements for storing the matrices can therefore be very large when a great plurality of user channels is used or when the input data packets comprise a large number M of data bits. If, e.g., each data packet has M bits and U packets arrive in one frame, the total number of bits is either U*M bits (when each packet has the same length) or $$\sum_{u=1}^{U} M_u$$

bits (when the packets have different lengths) for $u = 1 \ldots U$.

Whilst FIG. 5 for illustration purposes only shows the storage of the data bits d, of course the situation becomes more severe concerning the storage requirements, if the input data bit sequence containing M data bits is extended to also comprise a plurality of control bits for each data bit respectively code symbol as shown in FIG. 4.

SUMMARY OF THE INVENTION

As explained above, generally and in particular for a CDMA-system, each code symbol to be transmitted is stored together with its associated control information. If the control information is quite large for each code symbol, then the width of a memory location may be insufficient (when a predetermined address space is needed), since each set of control bits must be stored together with its associated data bits (i.e. in form of code symbols). In case that there is a great plurality of control bits the memory may not provide a sufficient number of bits per address such that additional read/write accesses must be performed which additionally increases the access time and the memory requirements. In other words, if the width of the memory locations would be sufficient then the RAM may not have enough address space, i.e. not a sufficient number of addressable memory locations, to handle all the data of all user channels.

Therefore, the object of the invention is to provide an interleaver, a transmitter, and a method which allow the storage and transmission of code symbols of a great plurality of user channels together with its respective control information with high processing speed and without needing a large memory in the processing section.

Solution of the Object

This object is solved by an interleaver according to claim 1 for interleaving input data bit sequences of M data bits comprising code symbols each consisting of a number N of data bits and control information consisting of a number L of control bits indicating specific states for each code symbol comprising combining means for combining the respective N data of each code symbol with the associated L control bits into a control information/code symbol data word of L+N bits; control information/code symbol encoding means for encoding said L+N bit control information/code symbol data words into data words of K bits, where K<L+N, according to a predetermined encoding scheme; and an interleaving memory for storing said encoded data words at memory locations thereof.

The object is also solved by a transmitter according to claim 11 for transmitting a data bit sequence of M data bits comprising code symbols each consisting of a number N of data bits together with control information consisting of a number L of control bits indicating specific states for each code symbol; comprising combining means for combining the respective N data bits of each code symbol with the associated L control bits into a control information/code symbol data word of L+N bits; control information/code symbol encoding means for encoding said L+N control information/code symbol data words into data words of K bits, where K<L+N, according to a predetermined encoding scheme; processing means for processing said code symbols of said encoded data words in accordance with their control information.

Furthermore, the object is solved by a method according to claim 13 for interleaving input data bit sequences of M data bits comprising code symbols each consisting of a number N of data bits together with control information consisting of a number L of control bits indicating specific states for each code symbol; comprising the following steps: combining the respective N data bits of each code symbol with the associated L control bits into a control information/code symbol data word of L+N bits; encoding said L+N bit control information/code symbol data words into data words of K bits, where K<L+N, according to a predetermined encoding scheme; and storing said encoded data words at memory locations of a memory.

This object is also solved by a method according to claim 18 for transmitting a data bit sequence of M data bits comprising code symbols each consisting of a number N of data bits together with control information consisting of a number L of control bits indicating specific states for each code symbol; comprising the following steps: combining the respective N data bits of each code symbol with the associated L control bits into a control information/code symbol data word of L+N bits; encoding said L+N control information/code symbol data words into data words of K bits, where K<L+N, according to a predetermined encoding scheme; processing said code symbols of said encoded data words in accordance with their control information; and transmitting said processed code symbols.

The invention in particular provides the major advantage, that the width of each memory location in a given storage means can be held small.

According to a first aspect of the invention, a combining means is used for combining the data bits of each code symbol with the associated control bits into a control information/code symbol data word. A control information/code symbol encoding means encodes this data word into a data word of less bits according to a predetermined encoding scheme. This encoded data word is then stored at memory locations of the memory used in the processing section. Therefore, instead of using more RAMs with bigger data width and less addressable memory space, the data symbols and the control information according to the invention will be encoded while using the available bit width. That is, by contrast to just storing control bits (e.g. four bits) together with one data symbol (e.g. two bits of one symbol) in one addressable memory location, the invention is based on the combining (encoding) of the data bits together with the control bits and the specific combinations (encoding) indicate a specific control function dedicated to the respective code symbol. Thus, a smaller bit width per memory location of the RAM can be used leading to relaxed memory requirements in the transmitter.

Having combined the data bits and the control bits and having encoded the combination into a data word of a smaller number of bits, a memory having a smaller number of bits per memory location can be used. This means that, using a memory of predetermined size, less bits have to be provided per memory location and thus a larger address space is obtained.

According to a second aspect of the invention, the data word resulting from the encoding of the data bits combined with the control bits is stored at one single memory location in the memory. Thus, each memory location comprises an encoded entity that indicates the code symbol as well as the control information as one word. Thus, it is prevented that more than one memory location has to be used for one symbol.

Advantageous Embodiments of the Invention

Applying the encoding principle according to the invention to an interleaver or the processing means of the encoder (or more generally the transmitter), a preferred interleaver according to the invention comprises the combining means and the encoding means when writing to memory locations of the interleaving memory, whilst a decoding means is provided for decoding the respective data words when read out by a read means from the interleaving memory. Advantageously, the separated code symbols and control bits can be provided to a modulator, which performs specific processing on the respective code symbols dependent on the control bits, e.g. a specific power setting for individual code symbols.

Hereinafter, the invention will be explained with reference to its embodiments as shown in the drawings and more specifically explained in the following description. Further advantageous embodiments, objects and improvements of the invention may be taken from the dependent claims.

BRIEF DESCRIPTION OF THE DRAWINGS

In the drawings:

FIG. 4 shows the storing of data bits and control bits in a memory according to the prior art;

FIG. 5 shows the storing of code symbols in an interleaving matrix according to the prior art;

FIG. 7 shows the inventive encoding of data bits & control bits and the associated control function in a memory according to the invention;

FIG. 8 shows a specific example for the combination of control bits FS, SS, MA, PW together with data bits Q, I when encoding the data in the encoding means CI/CS-ENC;

FIG. 9 shows a similar coding table as in FIG. 8, showing in particular the decoding function of the decoding means CI/CS-DEC at the output of the interleaving memory IM shown in FIG. 6;

FIG. 10 shows the storage of the data in an interleaving matrix, wherein the stored data words are a result of the encoding of the respective code symbols (N data bits) and control bits;

FIG. 11a shows entries in the interleaving memory IM, wherein each entry indicates the data bit position of the respective data bits forming a code symbol selected from the input data bit sequence (the control bits are not shown in FIG. 11a) for the case of N=2 and $N_W$=4;

FIG. 11b shows the entries of an interleaving matrix for N=4 and $N_W$=4 similar as in FIG. 11a;

FIG. 11c shows the entries of the interleaving matrix for N=2 and an odd $N_W$=7;

FIG. 13a shows an embodiment of the shift register SHR shown in FIG. 12 including two register banks b0, b1 for the case of N=2 and even $N_W$, also showing an embodiment of the selection means as a switch means SW1, SW2;

FIG. 14 shows a flow-chart of an embodiment of the interleaving method of the invention using the register banks as shown in FIG. 13a.

Figure 1:
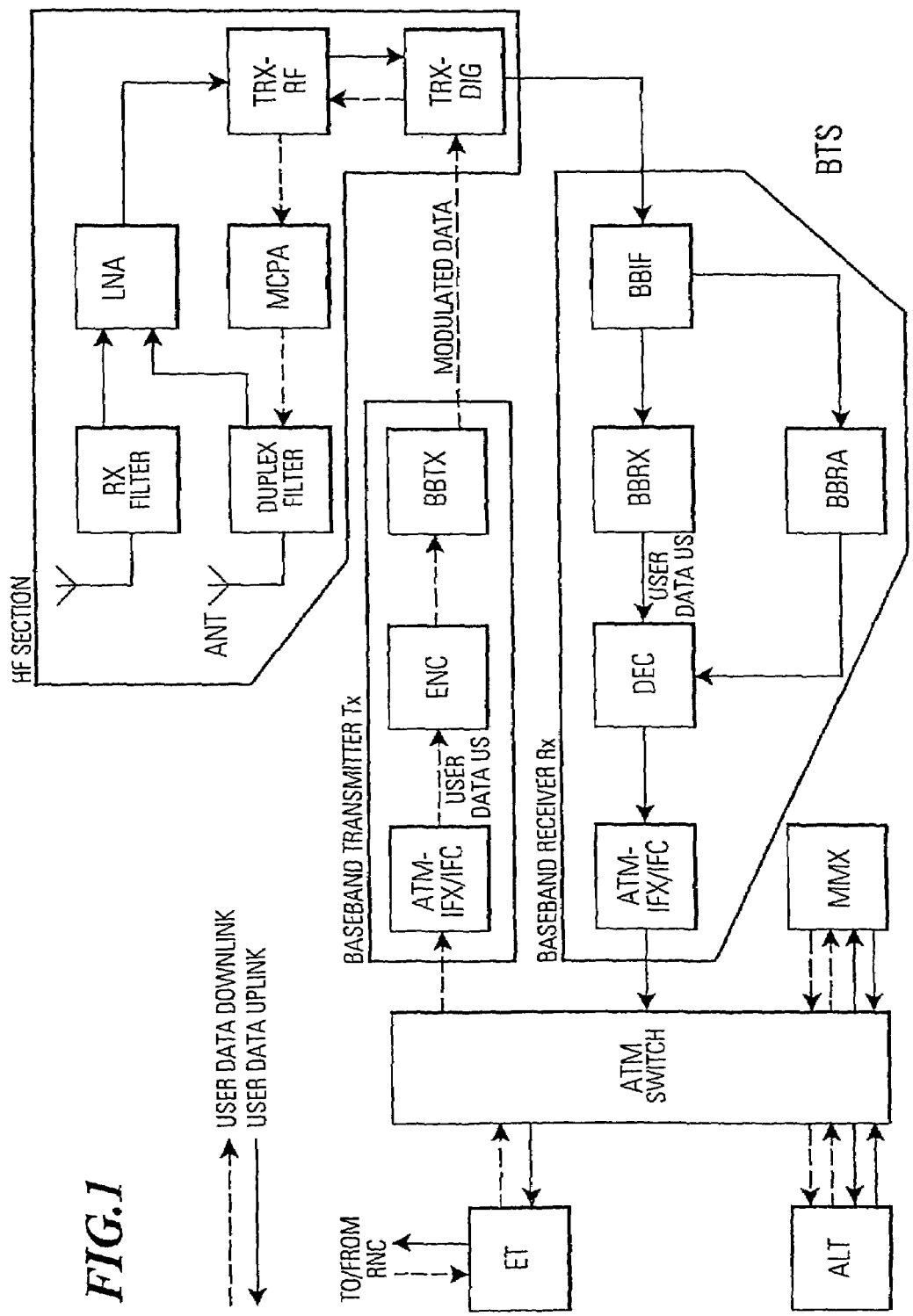
FIG. 1 shows a principle overview of a CDMA base transceiver station BTS, to which the invention can be applied.

In the drawings, the same or similar reference numerals denote the same or similar parts or steps everywhere. Hereinafter, first the combining and encoding principle of the invention will be explained with reference to FIG. 6. It should, however, be understood that the invention is neither restricted to a CDMA system shown in FIGS. 1, 2 nor is the invention limited to the case of a particular digital modulation scheme such as QPSK, 16QAM, etc.

In principle, the invention is neither restricted to a frame-wise provision of the input data bit sequences, nor do the individual successive frames have to have the same length, since an interleaving can be carried out according to any length of the input data bit sequence. Also the interleaving depth need not necessarily be an even number.

Principle of the Invention

Figure 3:
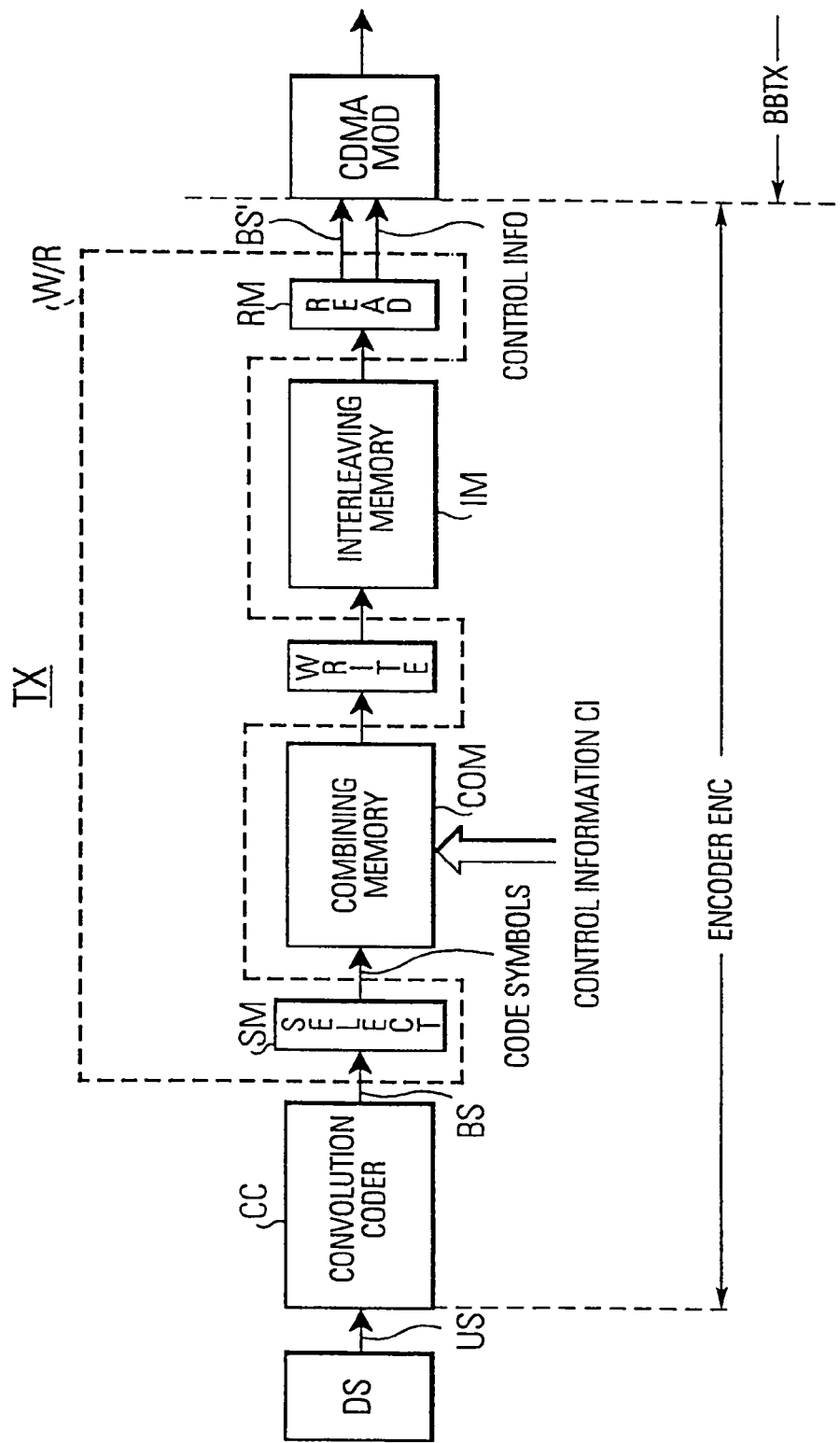
FIG. 3 shows a principle block diagram of a digital transmitter according to the prior art, showing as summary diagram an interleaving memory IM arranged between a channel coder CC and a digital modulator MOD.
Figure 6:
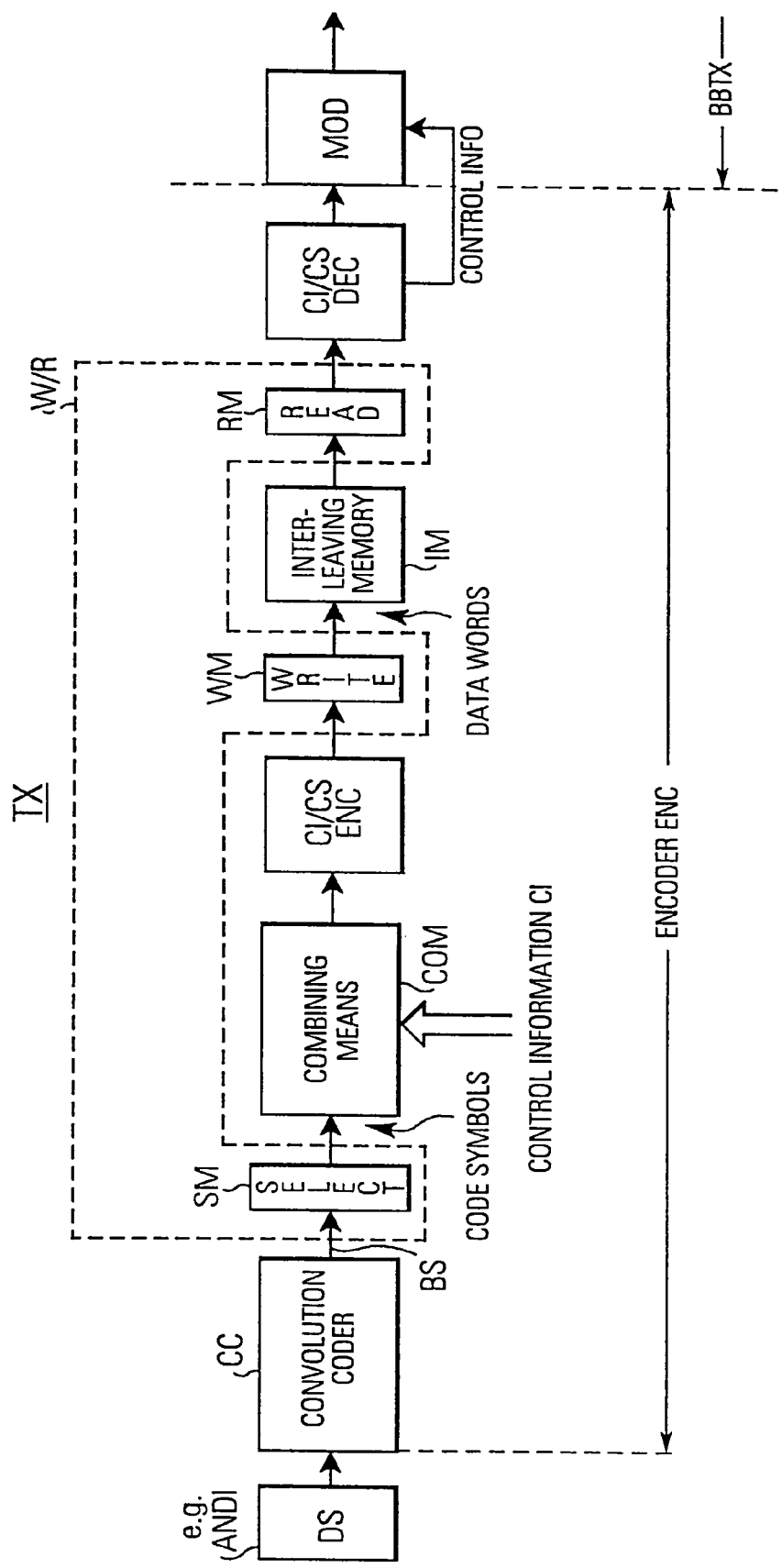
FIG. 6 shows an embodiment of an interleaver, encoder and transmitter according to the invention, specifically comprising an encoding means CI/CS ENC and a decoding means CI/CS DEC according to the invention.

FIG. 6 shows an encoder ENC similar to the configuration in FIG. 3. Generally, the encoder for transmitting a data bit sequence BS of M data bits for each user channel consisting of code symbols of a number N of data bits together with control information CI of a number L of control bits indicating control functions for each code symbol according to the invention comprises a combining means COM, a control information/code symbol encoding means CI/CS-ENC and a processing means for processing the code symbols with their control information combined in an encoded data word. The encoder ENC may further comprise a encoder CC.

The processing means can be formed by an interleaving memory IM, a write/read means W/R, and the control information/control symbol CI/CS decoder DEC.

A transmitter TX including such an encoder comprises the combining means COM, the encoder CI/CS-ENC and the processing means for processing the output of the control information/code symbol encoding means CI/CS-ENC as well as the modulator BBTX as explained with reference to FIG. 1.

It should be understood that a principle of the invention lies in the combining means COM and the encoder CI/CS-ENC with respect to the processing of the control bits and data bits, whilst the specific interleaving memory IM as well as the decoder CI/CS-DEC is a preferred embodiment of the processing means relating to the specific processing including an interleaving and a decoding as is shown in FIG. 6.

As shown in FIG. 6, a selection means SM of a write/read means W/R selects code symbols from the input data bit sequence BS which consists of M data bits. A preferred embodiment of how the selection can be done will be described below. A write means WM writes the data words formed by the encoding means CI/CS ENC into the interleaving memory IM and a read means RM reads the data words from the interleaving memory IM.

The code symbols each consisting of a number N of data bits are input to the combining means COM together with control information CI, i.e. the control bits for the respective code symbols. As described above, such control bits may indicate a frame start FS, a time slot start SS, a marker MA or a power bit PW for the code symbol (also combinations of these control bits are possible). The control information CI is generally input and determined by a central processing unit of the transceiver station. However, it is desirable to transmit such control information CI together with the code symbols (as shown in FIG. 4 and FIG. 7).

The combining means COM combines the respective N data bits of each code symbol with the associated L control bits into a control information/code symbol data word of L+N bits. As is seen in FIG. 7, the combination of data bits and control bits specify a particular function to be executed. The idea is that the control bits and the data bits are not processed separately from each other, but in a combined way, i.e. encoded to a specific data word indicating a specific function. Thus, in the encoded data word more information can be stored, whilst nonetheless the width of the memory does not have to be expanded.

FIG. 7 shows in each row a respective data word of L+N bits formed by the combining means. After this combining procedure, a control information/code symbol encoding means CI/CS-ENC encodes the L+N bit control information/code symbol data words into a data word of K bits, where K<L+N, according to a predetermined encoding scheme. As already indicated in FIG. 7 (and further illustrated with more detail in FIG. 8), the encoding to reduce the number of bits is only possible, if the total number of possible cases for the L+N bits is equal or less than 2 data width of the available data width. That is, combining the control bits and data bits into one data word and realizing that not all combinations of the L+N bits are possible allows to encode the data word into a data word with a smaller number of bits (or some cases can be treated equally).

If this combining means COM and the control information/code symbol encoding means CI/CS-ENC is used for providing data words as inputs to an interleaving memory IM, the interleaving memory IM stores the encoded data words at specific memory locations thereof as will be described with more detail below.

A decoding means CI/CS-DEC preferably decodes the read out data words again into the code symbols and the control bits according to an inverse of the predetermined encoding scheme. Preferably, the modulator MOD then uses the decoded control bits for performing specific processing of the read out and decoded code symbols.

As will be also explained below, a preferred embodiment of an interleaver using the means COM, CI/CS-ENC, the interleaving memory IM and the means CI/CS-DEC stores at each memory location of the interleaving memory IM one data word respectively consisting of the encoded combination of a code symbol and its associated control bits.

A preferred embodiment of the transmitter also comprises a convolutional encoder into which a data bit sequence is input and which outputs data bit sets each including a predetermined number 1/r of bits resulting from a convolutional encoding of a respective data bit using a predetermined coding rate, e.g. r=1/2, in a convolutional encoder CC preceding said interleaving memory IM. With the provision of data bits in parallel by the convolutional encoder CC, the selection process for selecting code symbols from the input data bit sequence BS can be accelerated, as will be seen with more detail in FIG. 13a.

FIG. 8 shows an example similar to FIG. 7 how the combining and encoding of the code symbols and the control bits FS, SS, MA, PW is performed. In FIG. 8 N=2 data bits (i.e. two data bits I, Q for a QPSK modulation) together with L=4 control bits are combined into one data word consisting of K=4 bits. As is seen in FIG. 8, by the encoding of the bit row FS, SS, MA, PW (control bits) and I, Q (code symbol) more complex information for the functional behaviour of one code symbol can be compressed to less bits.

Obviously, if the control bits FS, SS, MA, PW are stored without an encoding then 64 ($2^6=2^{N+L}$) different possibilities can be indicated. These 64 possibilities can of course not be maintained in the case of performing the encoding. That is, a reduction to 4 bits is only possible with the encoding, if some of the 64 combinations are actually not used or are redundant. However, if it has been realized that some of the combinations are not necessary, then, due to the encoding, in total only 4 bits are sufficient. This is only the case if from the 64 possible combinations of control bits and code symbols some cases do not occur at all or if two or more cases can be combined to one case (see "X" don't care in FIG. 8). Thus, the number of bits K is e.g. determined by $\lceil ld(2^{N+L}-Nu)\rceil$ if Nu denotes the number of combinations which are not used or are redundant.

The column "encoded data value (in hexadecimal notation)" denotes the encoded data word resulting from the encoding of the 6 bits formed by the 2 code symbol and the 4 control bits. As is seen, even though each combination of I, Q has associated combinations of control signals (see e.g. the row for the encoded data words 4, 5, 6, 7, where both SS and PW are "1"), the 16 different control functions for the individual code symbols can be encoded (as expressed with the hexadecimal notation) to only four bit (16 data words). Despite only using 4 bit in the encoded data word, there are still functions defined where Q, I can be arbitrary and still a specific control function is associated with it (see e.g. the hexadecimal values C, D, E and F). Thus, these bits denoted with "X" are irrelevant for the formation of the data word.

However, as it is seen from FIG. 8, there is no necessity to use all combinations of the 6 data control bits, since in fact the combination of the data bits and the control bits can be encoded into an encoded data word of a smaller number of bits, here K=4 for covering the max. 16 possibilities. The reduction of 6 bit to 4 bit reduces the memory space requirements (and possibly also the memory access time) as already explained above. A preferred storage of the encoded data word is such that the complete encoded data word of K bits is stored a one memory location, since each memory location in the interleaving memory IM (or in fact in any memory in a processing means of an encoder or transmitter) has a predetermined width that allows to store more than one bit. This will be further highlighted with reference to FIGS. 10, 11 and 12.

Any configuration of a transmitter and encoder using a processing means for processing code symbols together with control bits may benefit from the encoding as is shown in FIG. 8. Therefore, the invention is not restricted specifically to the usage and the storage requirements with respect to an interleaving, although the interleaver is a preferred embodiment of the invention.

With respect to the preferred interleaver, FIG. 9 shows the function of the decoding means CI/CS-DEC provided at the output of the interleaving memory IM. That is, reading out an encoded data value 0, 1, 2, 3 . . . A . . . F (hex notation) from the interleaving memory IM by the read means RM a decoding can be performed to extract the data bits I, Q, as well as the control bits FS, SS, MA, PW. Thus, the control information, which was originally sent as configuration data from a base station control means to the combining means COM, is now obtained again and can for example be preferably used by the modulator MOD. As shown in FIG. 9, the combinations of "X" for I, Q in FIG. 8 have been decoded or set with the data bits "0" during the decoding of the encoded words C, D, E and with the data bit "1" during the decoding of the encoded word F. However, since their specific data bit has no meaning before the encoding, they can be set to an arbitrary value.

Thus, the combining means, the encoder and the decoder cooperate such that during the processing, i.e. during the interleaving, a smaller number of bits are stored in a memory of the processing means, for example in the interleaving memory IM, such that the memory requirements can be reduced. Since a smaller number of bits need to be processed and transmitted this can potentially also reduce access and processing times in other units of the system.

Figure 12:
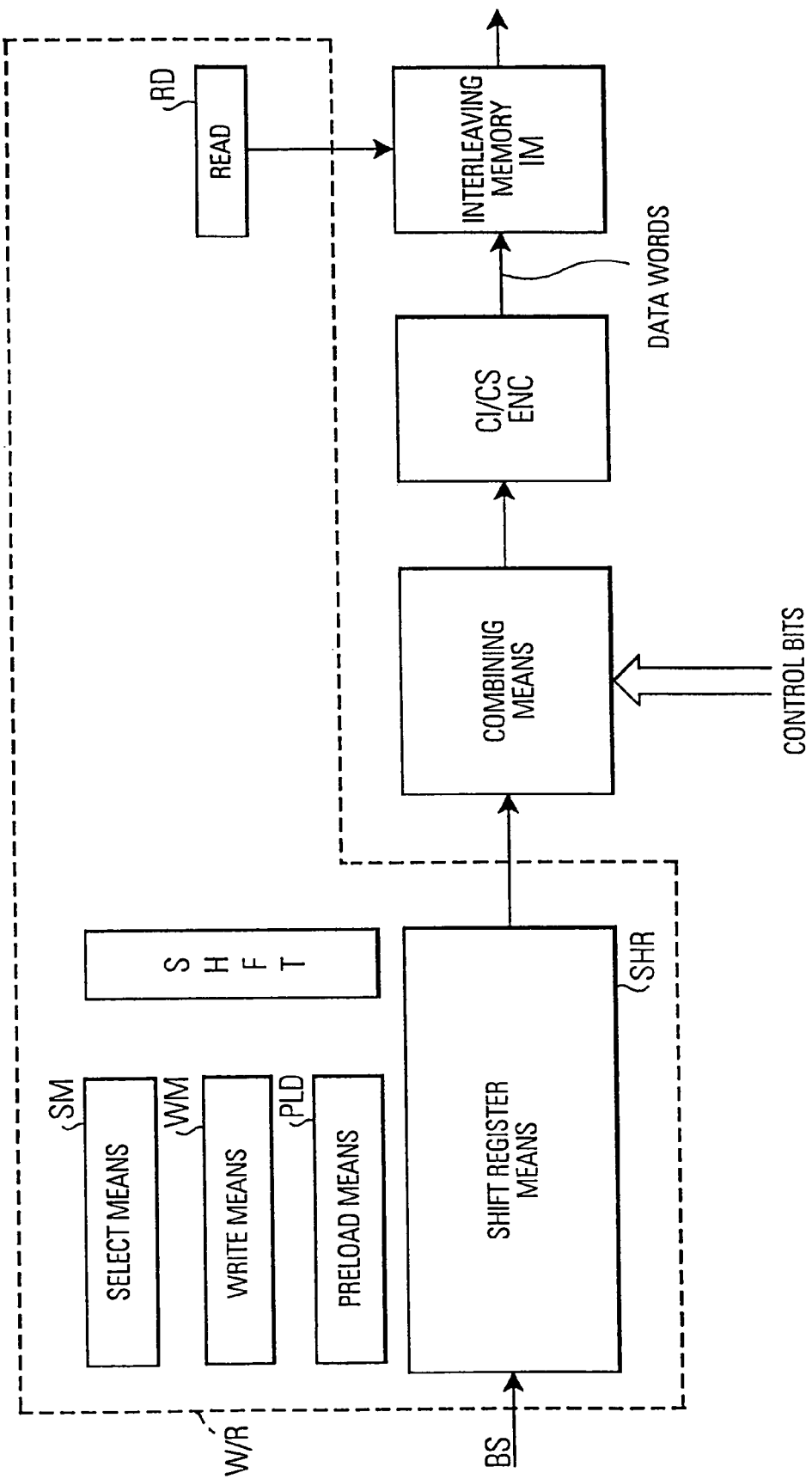
FIG. 12 shows an embodiment of the read/write means W/R for selecting the code symbols from the input data bit sequence.

FIG. 10, FIG. 11 and FIG. 12 show specific embodiments of an interleaver using such an encoding and decoding of data words as shown in FIG. 8, FIG. 9 in combination with FIG. 7.

Special Storage of the Code Symbols/Control Bits

As explained above, due to the data encoding in FIG. 8, a data word is formed which has a smaller number K of bits in comparison with the complete number N+L of bits available without the encoding. Again one possibility would be to also store the encoded data word with its bits at separate memory locations in the interleaving memory IM as explained above for the prior art in FIG. 5, or with the full bit width at one address.

According to a preferred embodiment of the interleaver according to the invention, a special storage of the encoded data words is performed as generally shown in FIG. 10. In principle, each encoded data word is stored at one memory location. That is, whilst FIG. 5 shows the "bit-wise" storage of the data bits in the interleaver matrix, FIG. 10 shows the usage of the IL matrix with encoded data words formed by the encoding of the data bits & control bits.

Before coming to a more detailed discussion of FIG. 10, one important aspect regarding the interleaving matrices should be noted. This aspect also relates to the interleaving matrix in FIG. 5. That is, as explained above, each packet contains a "data bit sequence" consisting of $M_i$ bits. Each "data bit sequence" fills one interleaving matrix. Therefore, each interleaving memory typically comprises several (a plurality of) interleaving matrices. That is, each interleaving matrix separately interleaves the data bits belonging to one packet.

FIG. 10 shows the interleaver matrix having a number of locations $IM_{00}$, $IM_{01}$, . . . for storing the encoded data words. As shown in FIG. 10, each location stores, an encoded data word (K bits) resulting from an encoding of a data word consisting of a respective code symbol comprising a predetermined number N of data bits selected from the input data bit sequence BS plus its associated control bits (L bits). Whilst FIG. 10 shows an example N=2, i.e. each code symbol consists e.g. of two bits I and Q for a QPSK modulation representation, the principle shown in FIG. 10 is generally applicable to any integer value of N. According to the invention, an intrinsic property of performing the interleaving in a interleaving memory is that each memory location can not only store one single individual bit, but a plurality of K bits for example K=4, K=8, K=16 or even K=32 bit for each memory location. Assuming that the encoded data word stored in each memory location consists of K bits, then the size of the interleaving matrix can be reduced to $N_W*N_R/K$ memory locations, whilst the interleaving matrix can still store the M data bits of the input data bit sequence together with the control bits for each code symbol. $N_W$ denotes the number of columns corresponding to the interleaving depth and thus for storing M data bits as encoded data words (K bits) resulting from an encoding of a respective code symbol (N bits selected from the M data bits) plus its control bits (L bits) using a predetermined interleaving depth, the interleaving matrix only comprises $N_R/K$ rows. Since in FIG. 10 the numbering in the column and row direction starts at 0, the highest column address is $N_W-1$ and the highest row address is $N_R/K-1$. Thus, selecting from the input data bit sequence of M bits respectively a number of N data bits as one code symbol, combining these N code symbol data bits with the L control bits in the means COM, encoding the N+L bits as an encoded data word of K bits and storing the encoded data word in one memory location, the access time and the needed memory space for the interleaving matrix IM in the interleaving memory can be reduced.

Of course, assuming that the same data bits as in FIG. 5 will again form the code symbol (e.g. for N=2 the combination of $d_0$, $d_{N_W}$) data bits of the data word before they are coded together with the control bits it is assumed that during the writing process in the row direction the respective data bits of the input data bit sequence are already present as the required set of data bits forming the corresponding code symbols. This selection of the appropriate data bits (for forming the code symbols of the respective data words) from the input data bit sequence by the selection means SM will be explained below with reference to FIGS. 11a, 11b, 11c.

Figure 2:
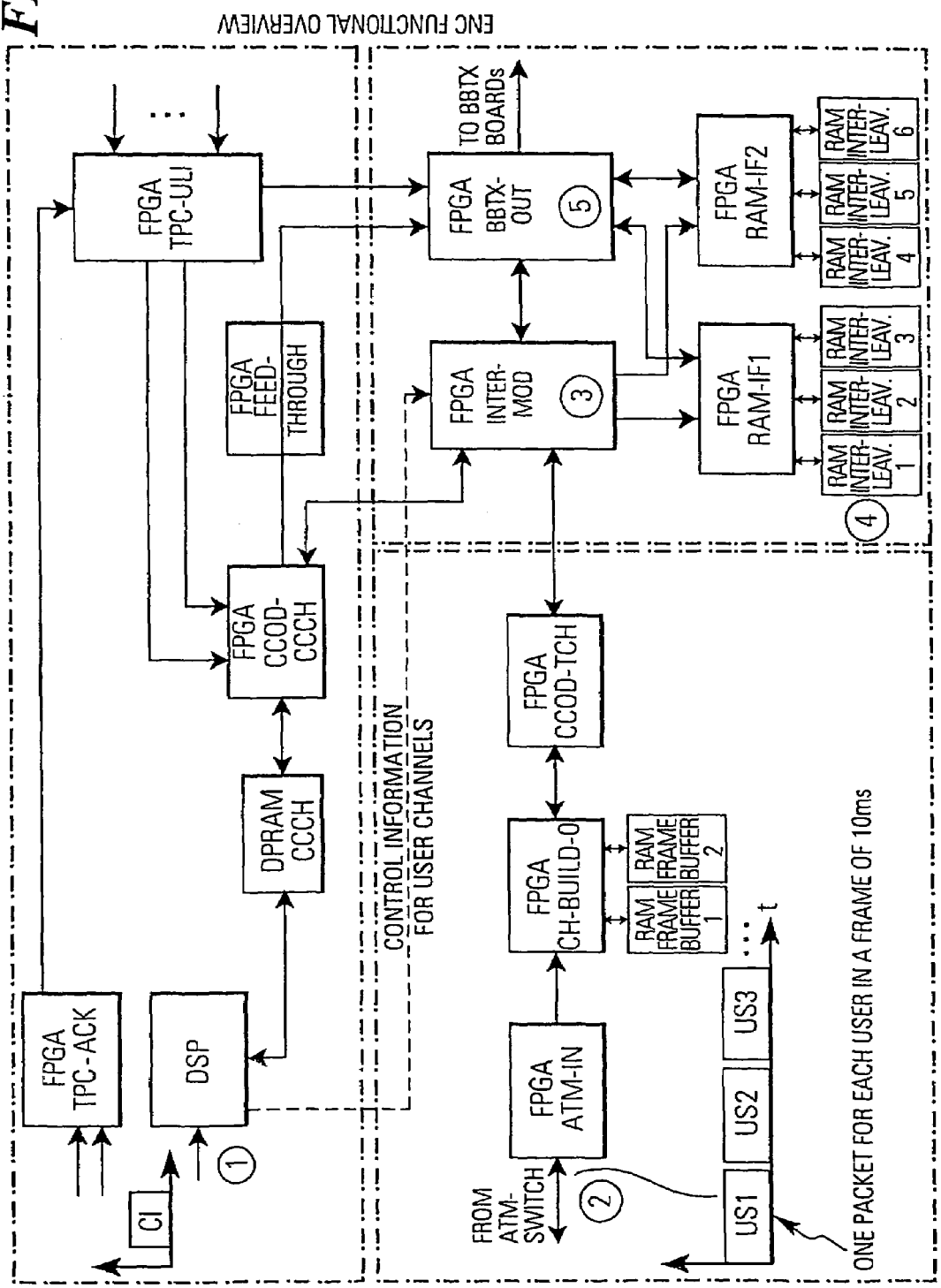
FIG. 2 shows an overview of the encoder block ENC shown in FIG. 1.

Since the CDMA base transceiver station BTS schematically illustrated in FIG. 1, FIG. 2 uses a QPSK modulation (i.e. N=2) the storage of all bits of an encoded data word resulting from an encoding of a code symbol (N bits) and its control bits (L bits) at one memory location as shown in FIG. 10 can advantageously be applied to this transmitter. That is, the user data (data bits and control bits) is not stored bit-wise but data-word-wise (I and Q data bits together with the control bits encoded as a data word having K bits) in the interleaving matrix, since the modulator MOD requests the provision of code symbols consisting of two bits I and Q and their associated control bits. Thus, the symbols $d_0$ & $d_{N_W}$, . . . , $d_{N_W-1}$ & $d_{2N_W-1}$ are selected for the data word to be encoded with its control bits and to be stored in the first row 0 in the interleaving matrix. Assuming an encoding to K bits it automatically follows that the number of rows required is only $N_R/K$ whilst the number of columns remains $N_W$ (i.e. the interleaving depth is the same as in FIG. 5). Storing the symbols as indicated in FIG. 10 decreases at least the read time from the interleaving matrix. That is, for the read process the matrix only has to be accessed $N_W*N_R/K$ times now.

In the write process, bits will be written to the matrix also only $N_W*N_R/K$ times. However, this presupposes that the code symbols, e.g. $d_0$, $d_{N_W}$ are already available as a data bit pair selected from the input data bit sequence by the select means before they are combined with the corresponding control bits to the respective data word which is then encoded to K bits before storage as an encoded data word of K bits in one memory location in the matrix. Since the data arrives serially from the convolutional encoder, the select means SM is provided to select the appropriate bits from the serially arriving input data bit sequence. According to one embodiment of the invention shown in FIGS. 12, 13, this can advantageously be carried out by using a plurality of registers as explained below.

However, before coming to a specific discussion of the embodiment of the selection, combining, encoding and storage process with respect to the code symbols representing the QPSK modulation (N=2), FIG. 11 is used to generally describe which data bits need to be selected for each code symbol (depending on an arbitrarily selected interleaving depth $N_W$ and code symbol length N), i.e. selected for the combination with the corresponding control bits as the respective data word to be encoded before storage in the memory. The illustration in FIGS. 11a, 11b, 11c respectively only show the data bits of the code symbol of the respective data word before combining and encoding them together with the control bits. Hereinafter, the selection process for the appropriate data bits forming one code symbol is described, however, it should be understood that the code symbols are of course first combined and encoded together with the control bits before they are written to the respective memory location as an encoded data word of K bits (K<N+L).

As was explained above, generally a read/write means (see W/R in FIG. 6 or FIG. 12) is provided for writing an encoded version of the data bits (code symbols) together with the control bits into the memory locations such that each memory location stores the encoded data word consisting of K bits resulting from the encoding of a data word consisting of a number N of selected data bits forming one code symbol together with the control bits and for reading out said encoded data words as K bits again from said memory locations and decoding them again into a data word consisting of the code symbol data bits (N bits) and the control bits (L bits) to provide the interleaved output data bit sequence of the stored code symbols and the control bits to the modulator MOD. Interleaving is achieved by different address generation for write and read process. Essentially, the modulation scheme determines how many data bits and which data bits need to be combined from the input data bit sequence.

For explaining the selection of data bits from the input data bit sequence BS by the select means SM the following assumptions are made. The bit positions in the input data bit sequence are numbered m=0, 1, 2 . . . M−1, i.e. the first arriving data bit has the index m=0. The interleaving depth (i.e. the number of columns) is $N_W$ and the first column index is denoted $n_W=0$. Likewise, the number of rows necessary in order to store the M data bits is $N_R/K$ (K being the total number of bits after encoding the selected data bits together with their control bits) and the first row index is denoted $n_R=0$ (see FIG. 11). N denotes the number of data bits per code symbol and n=1 denotes the first data bit, n=2 denotes the second data bit . . . n=N denotes the N-th bit of the code symbol. FIG. 11a shows the example for N=2 (i.e. QPSK modulation) and FIG. 11b shows the example for N=4 (i.e. 16QAM). The numbers in the matrices in FIGS. 11a, 11b denote the bit position m of the input data bit sequence having M data bits.

Whilst FIG. 11 shows for illustration purposes the bit positions m of the respective data bits forming the respective code symbols, the additional control bits, which are stored together with the code symbols are not illustrated, since they do not undergo the selection process by the select means SM, but are only appended to the respective code symbol in the combining means COM. The combination of selected data bits and the appended control bits is then encoded into the encoded data word.

In FIG. 11a an equation is stated that indicates the bit position m of the data bits that need to be combined for each code symbol and memory position. That is, the bit position m in the input data bit sequence is expressed as:

$$m = n_W + (n-1)*N_W + n_R*N_W*N \quad (1)$$

That is, each code symbol is formed by N respective data bits respectively selected from the m-th positions (as indicated with the above equation) of the input data bit sequence, where n=1, 2 ... N denotes the n-th data bit of the code symbol, $n_W$=0, 1 ... $N_W$−1 denotes the column address of the memory location of the code symbol and $n_R$=0, 1 ... ($N_R$/K−1) denotes the row address of the memory location of the respective data word comprising the encoded combination of the code symbol together with the control bits.

This is illustrated with an example in FIG. 11a (see the framed code symbols). For example, if the memory location $IM_{00}$ of the location $n_R$=0, $n_W$=0 in the top left corner is to be specified, then $n_W$, $n_R$, $N_W$ and N is entered in the above equation (1) and m(n=1)=0 and m(n=2)=4 indicate that the 1-st and the 5-th bit of the input data bit sequence is selected to form the code symbol $IM_{00}$=$d_0$,$d_4$ (or $d_4$,$d_0$, depending on the location of the most significant bit).

The code symbol $IM_{11}$=$d_9$,$d_{13}$ is formed by the 10-th and the 14-th bit of the input data bit sequence. This is carried out for all two-bit code symbols in FIG. 11a. Likewise, in FIG. 11b four data bits form one code symbol whilst still the above equation (1) can be used for determining the bit positions to be written to the respective memory location.

The above equation (1) also holds generally for an arbitrary interleaving depth $N_W$ in the column direction. Thus, effectively the same code symbols as would be supplied by an IL line in FIG. 5 are also supplied by an IL line in FIG. 10 using the general expression in equation (1), but the memory locations now each store a data word resulting from an encoding of the respective code symbol with its control information which are—after reading out and decoding—to be provided to the modulator MOD. This generally reduces the access time and the memory requirements.

The selection of the data bits according to the above given equation (1) is general and independent of the special combination of $N_W$, N and M and K. However, the main advantage is that the input data bit sequence having a length of M=$N_W$*$N_R$ bits can be written and read from the interleaving memory as data word resulting from an encoding respective code symbols together with their control bits) in only $N_W$*$N_R$/K write/read cycles.

As explained above, a method of the invention for interleaving an input data bit sequence of M data bits using an interleaving memory having a number of memory locations for storing the M data bits comprises a simultaneous selection of a predetermined number N of data bits from the input data bit sequence to form a respective code symbol (as illustrated with the above equation (1) and with reference to FIG. 11) and the combination of the code symbols with the control bits and the encoding of the combination into an encoded data word of smaller length (i.e. number of bits).

As can be seen from the above description, the interleaving scheme is also independent of the convolutional encoder, however, the input data bit sequence BS of M data bits can preferably consist of data bit sets each including a predetermined number 1/r of bits resulting from a convolutional encoding of a respective data bit using a predetermined coding rate, e.g. r=1/2, in a convolutional encoder CC shown in FIG. 6. However, the only information needed by the write/read means W/R is how long the input data bit sequence is (e.g. M) before a combining with the control bits, an encoding and a writing in of the interleaving matrix should be performed. Whether or not the actual data bits of the bit sequence relate to encoded or uncoded bits is of no relevance for the interleaving process itself, but in the case of convolutionally encoded bits, these bits can arrive parallely and thus the writing time, more specifically a preload time, can be reduced during the selection process as explained below with further details.

FIRST EMBODIMENT OF THE WRITE/READ MEANS

FIG. 12 shows an embodiment of the write/read means W/R used for selecting the data bits from the input bit sequence BS before they are combined, encoded and written as encoded data words to the interleaving matrix in the row direction and for reading out the encoded data words sequentially in the column direction to provide interleaved encoded data words which are then decoded into the data bits and the control bits to be provided to a modulation unit MOD generally shown in FIG. 6.

As shown in FIG. 12, the write/read means W/R comprises a shift register means SHR, a select means SM, a write means WM, a read means RD, a preload means PLD and a shift means SHFT. User data, i.e. the input data bit sequence BS, is input to the shift register means SHR.

It should be noted that the embodiment using a shift register means SHR and a select/write means SM/WM is only one embodiment of the invention in order to select the data bits from the input data bit sequence BS which are supposed to form a respective code symbol to be combined with the control bits in the combining means COM. Other embodiments are also possible, as long as the selection of the appropriate data bits for the formation of the respective code symbols is guaranteed.

Independent of the number N of data bits forming the code symbol and independent of the interleaving depth $N_W$ one possibility of the selection of the data bits is of course to use a single shift register of length M, whereafter the select/write means SM/WM will run through the complete data bit sequence of M bits and will perform the respective selection of the data bits. However, this may not be a very feasible solution, since the number of data bits M per bit sequence may be very large.

However, for the sequential formation of the code symbols it is not necessary to have available the complete data bit sequence of M bits in a shift register, but it is only necessary to have available in a shift register respectively at each clock timing the two (or N) bits that will form the respective code symbols. As is seen in FIGS. 11a, 11b and as is also indicated with the above equation (1), it is sufficient to have available simultaneously in a shift register means SHR the respective data bits of bit positions m (n=1), m (n=2) ... m (n=N) which respectively form a code symbol. Therefore, the length of the shift register in the shift register means SHR only need to be N*$N_W$ or it is possible to provide N registers each having a length of $N_W$. Stepping through the memory locations by changing the row index (the writing of code symbols is performed in the row direction), of course a shift means SHFT is necessary in order to sequentially shift the registers in order to have available in the shift register the data bits to be stored (encoded with the control bits) as encoded data words in the new memory location, whilst during the shifting of the shift register already new bits can be read in from the input data bit sequence.

As will be explained below, with a more concrete example for N=2 in FIG. 13a, FIG. 14, it is possible to always read data bits from a first register at particular register positions and then switch to the reading from another register in the next step, wherein the next step here means that the next memory location in the row direction is written with an encoded data word resulting from the encoding of the selected data bits (code symbol) together with their control bits.

If for example the even index input bits of the input data bit sequence are stored in a first register and the odd index bits are stored in a second register, then a code symbol reading can be carried out alternately between the first and second register if $N_W$ is an even number. Namely, as is seen in FIGS. 11a, 11b, independent of the selected number N, a present code symbol, e.g. $d_0, d_4, d_8$, is always formed of bits at even bit positions whereas the code symbol for the next (row-wise) memory location is formed by $d_1, d_5, d_9$, i.e. bits at odd bit positions before they are combined with their respective control bits. Therefore, in FIG. 11a two bits are respectively read alternately from the first and second register. It is interesting to note that this alternate reading from the registers is independent of N, however, it is not independent of $N_W$. As is shown in FIG. 11c, for $N_W=7$, i.e. for an odd $N_W$, each code symbol of the respective data word is formed by a combination of a data bit at an even position and a data bit at an odd position (e.g. $d_0, d_7$ or $d_{15}, d_{22}$). This is also generally true for any N, as is indicated with the dashed line in FIG. 11c. However, the above-mentioned equation (1) generally also holds for this case, since it indicates the exact bit positions to be read from the input data bit sequence.

Also in the above case for an odd $N_W$, i.e. an odd interleaving depth, only one register of length $N*N_W$ or N registers of length $N_W$ will be sufficient, only that now bits will have to be read from specific bit positions from several registers simultaneously. As will be appreciated from FIGS. 11a, 11b, as long as $N_W$ is an even number, the odd bits can always be read for each code symbol independent of N from one register and the even bits from the other register. In FIG. 11c, for the general case of $N_W$ being odd, it is possible to derive relationships as to which bit positions should be alternately read from all the shift registers for each N.

SECOND EMBODIMENT (N=2 AND R=1/2)

Hereinafter, with reference to FIG. 13a, FIG. 14 an embodiment is described for forming code symbols consisting of two data bits, i.e. N=2 for an arbitrary (even) $N_W$. It should be noted that this embodiment advantageously uses parallely output data bits from a convolutional encoder operating with a coding rate of r=1/2, however, it is also possible that the data bits arrive serially, in which case different timing relationships must be considered. However, the embodiment with several shift registers as shown in FIG. 13a and described hereinafter is not restricted to a combination with a particular convolutional encoder of r=1/2, since the number of (parallely) output data bits from the convolutional encoder is not directly linked to the number of data bits forming one code symbol. That is, the channel encoder performs a special channel encoding outputting a predetermined number of bits, whilst the modulation scheme (QPSK, 16QAM etc.) in the modulator determines how many data bits form one code symbol.

As is seen in FIG. 13a, the embodiment of the shift register means SHR comprises two shift register banks $b_0, b_1$ each consisting of a first register $b_0 r_0, b_1 r_0$ and a second shift register $b_0 r_1, b_1 r_1$. The length of each shift register corresponds to the interleaving depth $N_W$. The switch means SW1, SW2 output the data bits to be stored at the respective memory location in the interleaving matrix IM (together with the respective control bits as an encoded data word) which is addressed by the write means WM. That is, the shift registers are located before combining means and the bit interleaving matrix IM (e.g. a RAM) used for interleaving.

As is seen in the section "after preload" (the preloading will be described with more detail below) the first register of the first bank $b_0 r_0$ stores $N_W$ data bits of even bit positions in the input data bit sequence. Similarly, the first register of the second bank $b_1 r_0$ stores data bits from the odd bit positions of the input data bit sequence, respectively indicated with $d_0, d_2, \ldots, d_{2N_W-2}$ and $d_1, d_3, \ldots, d_{2N_W-1}$ in FIG. 13a. As stated above, various possibilities can be used in order to have the odd and even bits present in the first and second respective register. In a preferred embodiment, it is easy to clock in the respective odd and even data bits into the two registers, if the convolutional encoder outputs two bits parallely for a r=1/2 encoding. Such bits then arrive on the two data lines coming from the convolutional encoder as is schematically shown in FIG. 13a (data 0, data 1).

Figure 13B:
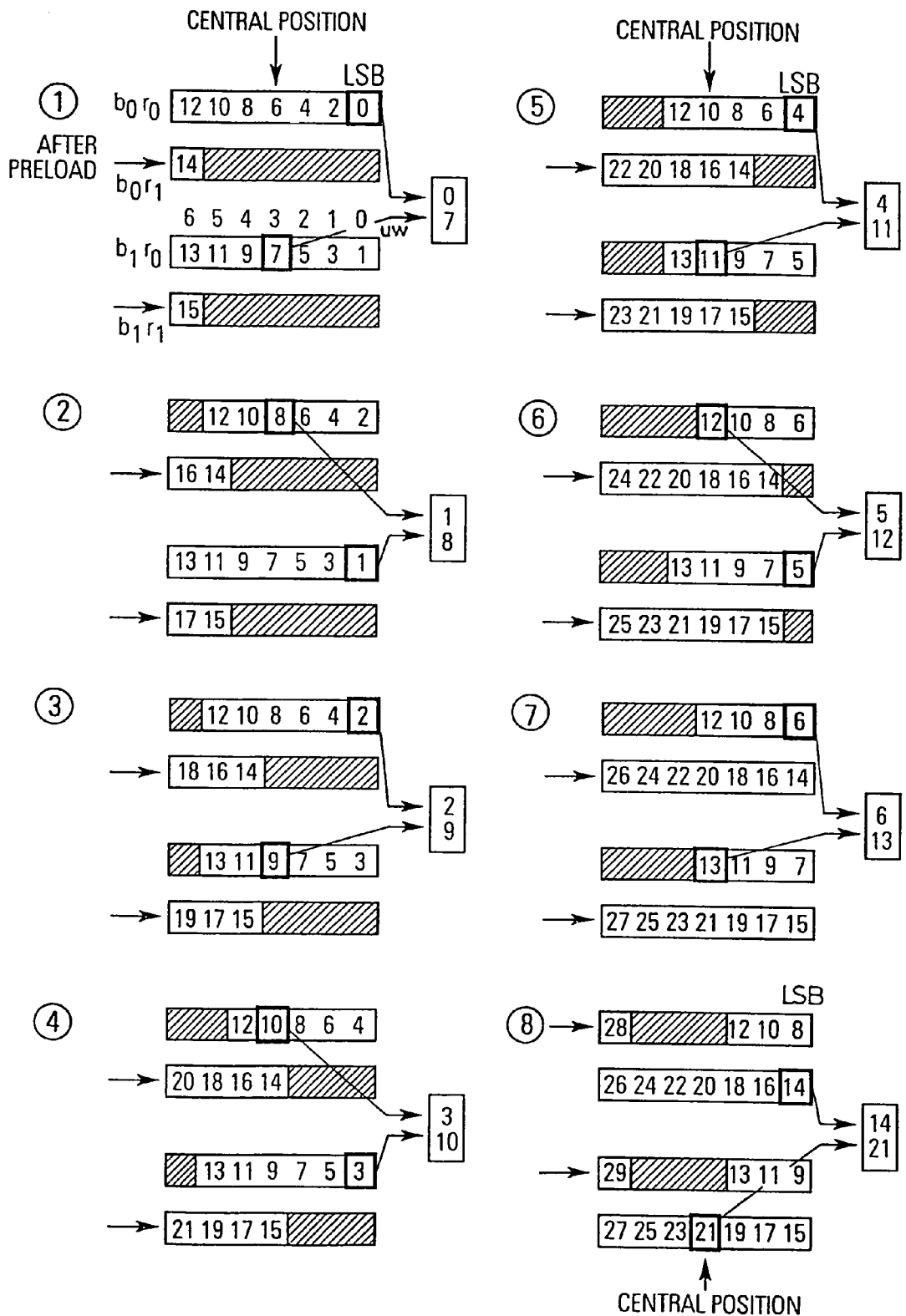
FIG. 13b shows an embodiment of the shift register SHR shown in FIG. 12 including two register banks b0, b1 for the case of N=2 and an odd $N_W$(here $N_W$=7)

The provision of the registers (having length $N_W$ and having bit positions numbered 0, 1 . . . , $N_W$ beginning with the least significant bit position 0 at the far right) will allow to form the code symbols to be combined and encoded with the control bits for all memory locations of one row, as may be taken from FIG. 11a. As can be seen from the "write step 1", each code symbol in FIG. 13a (for even $N_W$ consists alternately of two data bits selected from two specific bit positions in one respective register. In FIG. 13b (for odd $N_W$) each code symbol consists of two data bits selected for two respective bit positions in two separate registers as explained below in more detail.

That is, the select means SM respectively reads the least significant bit $d_0$ at the least significant bit position 0 at the far right end in FIG. 13a (which was the first bit loaded during the preload phase) and the bit $d_{N_W}$ at the bit position $N_W/2$ (if the bit positions are numbered from 0 to $N_W-1$ as described above) which are output as code symbol and which are then combined and encoded together with the respective control bits and written to memory location $IM_{00}$. For the example in FIG. 11a, this would be the code symbol (0,4).

Then, the switch means SW1, SW2 switches to the first register of the second register bank $b_1 r_0$ containing the bits of the odd bit positions. Thus, the code symbol $d_1, d_{N_W+1}$ is read from the least significant bit position 0 at the far right end in the register and the bit position $N_W/2$ in the shift register $b_1 r_0$. For the example in FIG. 11a, this would be the code symbol (1,5).

As is also indicated in "write step 1", after each reading the shift means SHFT shifts the register which was read in the last write cycle. That is, when a bit pair is read from the first register of the second bank, the first register of the first bank is shifted one bit. Thus, the first register of the first bank is prepared to allow the reading out of the next code symbol for the next memory position from the same bit positions as before. Simultaneously, as is indicated in the "write step 1" the data bits of the next $2N_W$ bit positions are read into the second registers of the first and second bank, where again the second register of the first bank stores the even bits and the second register of the second bank stores the odd bits.

That is, while one register in a bank is loaded with bits, two bits of the other one are read out to the interleaving matrix IM. The two registers of each bank change their function alternately after $N_W$ clock periods. It is seen from FIG. 10, that the writing of one memory location in the matrix requires the provision of pairs of data bits, e.g. $d_0$, $d_{N_W}$ which are then combined with the control bits and encoded. Actually stored at the memory location are then the bits of the encoded data word. The provision of four registers as in FIG. 13a enables a pre-storing of the bits as well as a grouping of bits and selecting of bits pair-wise, whilst still only $N_W$ clock periods are necessary for forming the respective pairs of one row. Thus, the write time becomes the same as the read time since in every period ($N_W$ cycles) $2*N_W$ bits can be stored to the interleaving matrix.

As is shown in FIG. 13a an additional "preload" time is needed by a preload means PLD for loading the shift registers SHR for the first time. As will be appreciated, since one row (e.g. row 0) in FIG. 10 has to store a total of $2N_W$ bits, the shift register SHR has to have a length of $2*N_W$ if data arrives from the convolutional encoder in a serial form. Due to the fact that the data arrives serially at the interleaver ③ in FIG. 2, i.e. serially at the shift register SHR in FIG. 12, $2N_W$ clock periods are needed in addition to the write accesses in principle.

However, in a convolutional encoder of rate, e.g. r=1/2 two bits $d_0$, $d_1$, are generated in a parallel form and the two bits could arrive at the same time. If the bits thus arrive in parallel, a reduction of the preload time needed by the preload means PLD for loading the shift registers $r_0$ with the odd and even bits can be achieved, when the two registers with length $N_W$ are loaded during the "preload" time of now only $N_W$ clock periods. Therefore, the combination of a convolutional encoder of r=1/2 with code symbols of N=2 is a very advantageous embodiment. Then the clocking in of data bits in pairs of two can be performed at the same clock rate as the reading out of the respective two bits from the respective shift registers. That is, during the clocking in of $2N_W$ bits, exactly $2N_W$ bits for code symbols of memory locations in one row are read out from the respective other registers and are then combined with the control information bits.

Therefore, whilst in general the idea of the invention is directed to the symbol-wise combination of two bits together with the control bits and to the encoding of the data word formed therefrom and the storing of bits of the encoded data word in one location of the interleaving matrix, it is particularly advantageous if the QPSK modulation method together with a convolutional encoder of rate 1/2 and two parallel shift register banks is used. However, as explained above, the invention can also be generally applied with a single register of length $2*N_W$, only that here the "preload time" is twice as long.

THIRD EMBODIMENT (INTERLEAVING METHOD FOR N=2, EVEN $N_W$)

Figure 14:
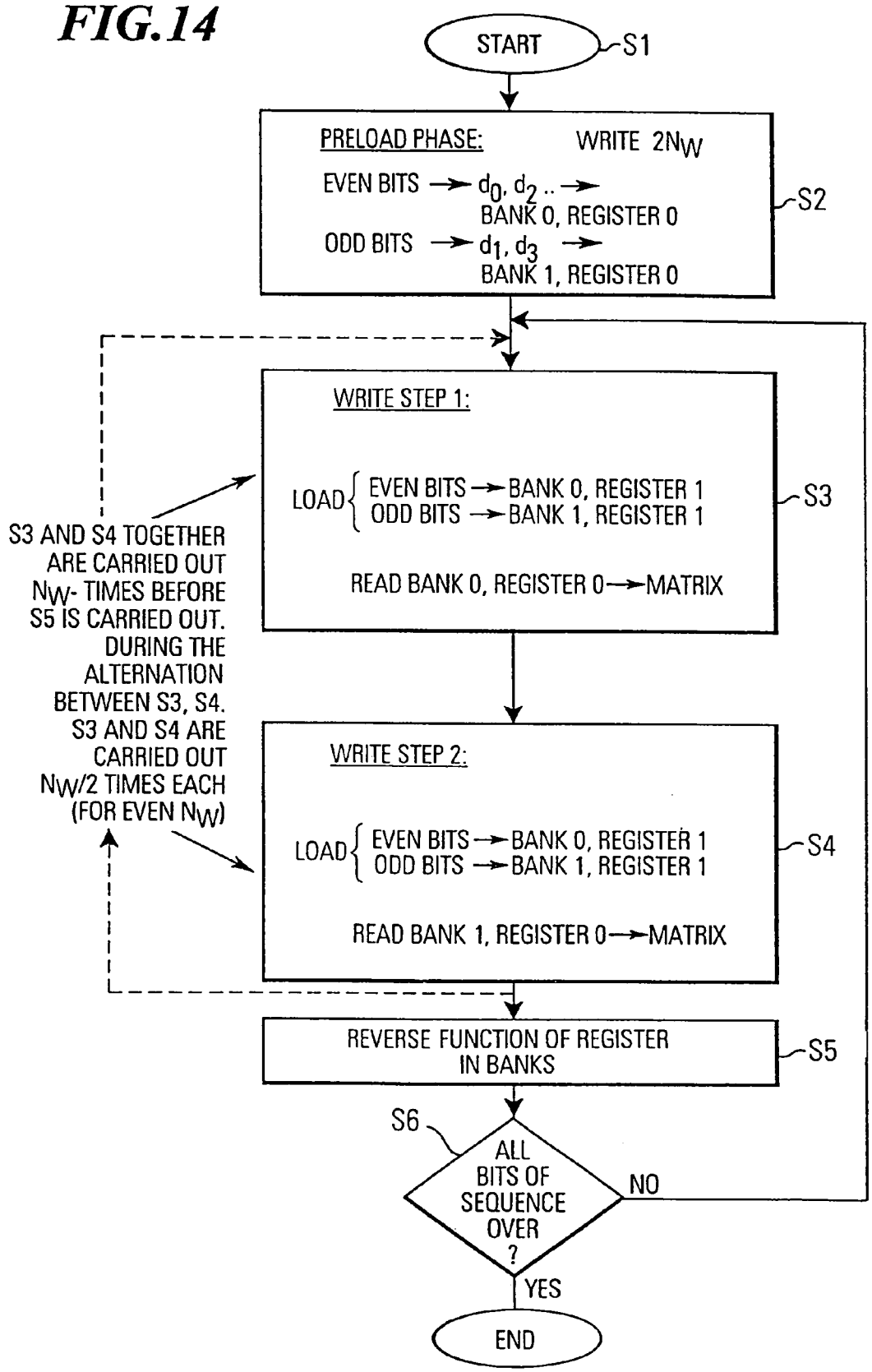

Whilst the specific usage of the register banks is shown generally in FIG. 13a, where data bits from a convolutional encoder with r=1/2 are stored in four registers and where the data selection is done parallely, FIG. 14 shows a flow chart of the operation for the interleaving method of N=2 in FIG. 13a.

In step S2, the so-called "preload phase", in total $2N_W$ bits are stored in registers 0 of bank 0 and bank 1. As is seen in FIG. 13a, the even bits $d_0$, $d_2$ ... $d_{N_W-2}$, $d_{N_W}$ ... $d_{2N_W-2}$ are stored in $b_0r_0$(bank 0, register 0) and the odd bits $d_1$, $d_3$ ... $d_{N_W-1}$, $d_{N_W+1}$ ... $d_{2N_W-1}$ are stored in $b_1r_0$ (bank 1, register 0). Thus, a length of $N_W$ for each register is completely sufficient. After completing step S2, in total the bits $d_0$ to $d_{2N_W-1}$ are stored in registers.

In step S3 the bits stored in the two registers in step S2 must be combined to be written with the control bits encoded together to a first memory location 0 in the interleaving matrix. Therefore, in step S3 one symbol is read from those registers. Essentially, in FIG. 13a the gray-shaded rows in the "preload phase" correspond to the symbols stored in row 0 in FIG. 10 if the switches SW1, SW2 respectively select odd and even bits from the respective register. Simultaneously with the reading of bits from bank 0, register 0 and bank 1, register 0, the registers 1 of banks 0 and bank 1 are filled with a number of $2N_W$ bits intended for the next row 1 in the matrix in FIG. 10. The next $2N_W$ data bits are denoted $d_{2N_W}$ to $d_{4N_W-1}$.

The operation of the switch means SW1, SW2 is such that the correct pairs of bits are selected. While reading the registers a symbol is therefore built by taking two bits of one register. For the first symbol, the bits $d_0$ and $d_{N_W}$ of register 0 in bank 0 are taken. Whilst in the position of the switches SW1, SW2 in FIG. 13a the data $d_0$, $d_{N_W}$ have been read out from two particular bit positions of register 0 in bank 0, the switches are then set to read one symbol, i.e. 2 bits $d_1$, $d_{N_W+1}$ from the register 0 of bank 1 at exactly the same bit positions in write step 2. Whenever a pair of bits has been read from a register, the contents of the register is shifted one bit to the right (as can be seen from the blank bit position in register 0, bank 0 in "write step 1" in FIG. 13a).

If in step S3/S4 the switches SW1, SW2 have respectively been switched to read a pair from bank 0/1 the corresponding register is shifted one bit to the right.

As is indicated with the square boxes at the arrows denoted data i, data q, in FIG. 13a these square boxes always indicate the last read pair of bits (one symbol) from the respective register. The alternate reading (and shifting) of a pair of bits respectively from bank 0, register 0 and bank 1, register 0 in the write step 1 and the write step 2 is performed in total exactly $N_W$ times for setting one row of data symbols until the process changes to the alternate reading (again $N_W$-times) from bank 0, register 1 and bank 1, register 1 into which the next data bits have been written during the alternate reading process from bank 0, register 0 and bank 1, register 0.

Thus, while reading the register a symbol is built by taking two bits of one single register. For the first symbol, the bits $d_0$ and $d_{N_W}$ of register 0 in bank 0 are taken. The position for read out is kept, but in the second reading the register 0 of bank 1 is used and data bits $d_1$, $d_{N_W+1}$ are read. Then the register contents is shifted to the right.

Therefore, once the preload step S2 is finished, the registers are shifted every second clock period (during the whole read period) while the output lines for the I and Q bits switch from one to the other bank with every clock period. Thus, the outgoing I bit and the Q bit will be stored as symbol together to the same memory address of the interleaver matrix IM.

As is indicated in step S5, obviously, after having read $2N_W$ data bits, having combined them with the control bits, encoded same into an encoded data word and stored these as encoded data words in the matrix IM, the function of the registers 0, 1 of each bank is reversed. Namely, as explained above, after $N_W$ clock periods the complete data necessary for selecting symbols in the next row need to be read from the register 1, whilst the next data for the row 3 will again be stored in the register 0 of each bank.

Essentially, table 1 shows the sequential reading of code symbols from the registers:

TABLE 1

|  | Write Step 1 | Write Step 2 | Write Step 1 | Write Step 2 |
|---|---|---|---|---|
| The reading order from SHR is | $(d_0\ d_{Nw})$ | $(d_1\ d_{Nw+1})$ | $(d_2\ d_{Nw+2})$ | $(d_3\ d_{Nw+3})$ |
|  | reg φ bank φ | reg φ bank 1 | reg φ bank φ | reg φ bank 1 |

The process described in FIGS. 13a, 14 allows to fill the interleaving matrix exactly in $N_W * N_R/K$ access steps, namely in exactly the same time that is necessary for reading out the interleaving matrix, wherein additional $N_W$ cycles are needed for preloading the shift registers. Thus, the complete interleaving and forming of code symbols can be done in less time with less memory requirements.

FOURTH EMBODIMENT (INTERLEAVING METHOD FOR N=2, ODD $N_W$)

As explained above, even when $N_W$ is an odd number, the above described method can be applied. But then, in step S5, the positions for reading I and Q bits have to be changed after $N_W$ clock periods. This is explained with reference to FIG. 13b below.

FIG. 13b shows in step ① the situation in the "after preload" as in FIG. 13a for the case of N=2 and an odd $N_W$=7. 14 (=2$N_W$) bits are stored in the registers $b_0 r_0$ and $b_1 r_0$ and two bits 14, 15 will be written into the registers $b_0 r_1$ and $b_1 r_1$, respectively, when bits 0, 7 are read out in the first reading out process of "write step 1".

In the first $N_W(N_W=7)$ steps ①–⑦, code symbols are read out alternately either from the least significant bit position LSB (at the far right end position 0) of the register $b_0 r_0$ and from the central position ($N_W$–1)/2 (if the bit positions are numbered from 0 to $N_W$–1 as described above) of the register $b_1 r_0$ or from the central position of the register $b_0 r_0$ and the least significant bit position LSB (at the far right end) of the register $b_1 r_0$ whilst the respective even and odd bits are successively read into the registers $b_0 r_1$, $b_1 r_1$, which are fully filled after step ⑦. For the next cycle of steps beginning with step ⑧, the alternate reading starts again, now reading alternately the least significant position LSB in the register $b_0 r_1$ and the central position in register $b_1 r_1$ and vice versa.

Thus, the procedure for odd $N_W$ is essentially the same as the one for even $N_W$, only that in the "write step 1" in FIG. 14, the reading is performed from two different banks b0r0 & b1r0 and "in the write step 2" in FIG. 9 the reading is also performed from two different banks b0r0 & b1r0. In total, step S3 and step S4 together are carried out $N_W$(=7) times, before the registers are switched in step S5.

Essentially, table 2 shows the sequential reading of code symbols from the registers for odd $N_W$ which is essentially the same as the one for even $N_W$, only that two different registers are used for reading each code symbol pair:

TABLE 2

|  | Write Step 1 | Write Step 2 | Write Step 1 | Write Step 2 |
|---|---|---|---|---|
| The reading order from SHR is | $d_0$ from $b_0 r_0$ $d_{Nw}$ from $b_1 r_0$ | $d_1$ from $b_1 r_0$ $d_{Nw+1}$ from $b_0 r_0$ | $d_2$ from $b_0 r_0$ $d_{Nw+2}$ from $b_1 r_0$ | $d_3$ from $b_1 r_0$ $d_{Nw+3}$ from $b_0 r_0$ |
|  | reg φ bank φ and reg φ bank 1 | reg φ bank φ and reg φ bank 1 | reg φ bank φ and reg φ bank 1 | reg φ bank φ and reg φ bank 1 |

The result of a reading and writing process for $N_W$=7 is shown in FIG. 11c.

INDUSTRIAL APPLICABILITY

As explained above, a first aspect of the invention resides in the combination of the control bits and the data bits of a respective code symbol and in the encoding of this combination into a new data word. Such a combination and encoding process can be used at any stage in a processing means of a transmitter or an encoder. If the combining and encoding process is specifically used in an interleaver, then the encoded data word is stored with all bits at one individual memory location in the interleaving memory IM, whilst after reading out the data words from the interleaving memory IM a decoding process again obtains the original code symbols and their associated control information (control bits) due to an inverse of the encoding scheme used during the encoding process. The control bits can then for example be provided to a modulator to perform specific processing for each code symbol.

Furthermore, according to the invention the encoded data word formed by an encoding of a combination of the data bits together with the control bits is stored at one memory location of the interleaving memory, (or in general in a memory of a processing means of the transmitter or encoder). Here, the fact is used that each memory location can store more than one bit and thus the read/write time necessary for reading/writing to/from the memory can be reduced and a smaller size memory can be used. After reading out the data bits of the stored encoded data word this data word is decoded using an inverse of the encoding scheme used and the code symbol data bits and the respective control bits are provided to the modulator.

Although the invention has been described specifically for a CDMA communication system, where a plurality of user channel provide a data information in packets, it should be noted that the invention can be applied to any communication system, transmitter and receiver where code symbols need to be processed together with control information. Therefore, the invention is not specifically limited to the CDMA base transceiver station as described above.

Furthermore, the invention is not restricted to any embodiment or example described herein and the above described embodiments are presently perceived as the best mode of the invention. Therefore, a skilled person can perform various modifications and variations within the scope of protection on the basis of the above teachings. Furthermore, the invention can comprise separate features disclosed in the specification and described in the claims even when not specifically mentioned in the description. Therefore, the scope of the invention is not limited to the specific embodiments described herein and comprises all features and combinations as defined by the scope of the appended claims.

The invention claimed is:

1. An interleaver of a transmitter for interleaving input data bit sequences of M data bits comprising channel encoded code symbols each consisting of a number N data bits and control information associated with every code symbol, to be used to control processing in said transmitter and consisting of a number L of control bits indicating specific states for each corresponding code symbol; comprising:
   a0) a channel encoder for receiving digital data in the form of packets from a data source and for encoding said digital data into said channel encoded code symbols of said number N of data bits;
   a) combining means for combining the respective N data bits of each channel encoded code symbol with the associated L control bits into a control information/code symbol data word of L+N bits;
   b) control information/code symbol encoding means for encoding said L+N bit control information/code symbol data words into data words of K bits, where K<L+N, according to a predetermined encoding scheme, and
   c) an interleaving memory for storing said encoded data words at memory locations thereof.

2. An interleaver according to claim 1, further including a write/read means for writing said encoded data words to an interleaving matrix within said interleaving memory at specific memory locations in a row direction and for reading out said encoded data words from said interleaving matrix in the column direction and a control information/code symbol decoding means for decoding said K bit data words read out from said interleaving matrix in said interleaving memory into said N bit code symbols and said L bit control bits according to an inverse of said predetermined coding scheme.

3. An interleaver according to claim 1, wherein L=4 and N=2, wherein said control bits indicate one or more of a frame start, a time slot start, a marker, and a power bit for the code symbol consisting of said 2 data bits.

4. An interleaver according to claim 1, wherein one control bit indicates a transmission power ON/OFF control of said code symbols.

5. An interleaver according to claim 2, wherein each memory location stores one data word respectively consisting of said encoded combination of a predetermined number N of data bits selected from said input data bit sequence by a selection means of said write/read means and said control bits.

6. An interleaver according to claim 1, wherein said channel encoder comprises a convolutional encoder; and
said input data bit sequence of M data bits consists of data bit sets each including a predetermined number of bits resulting from a convolutional encoding of a respective data bit using a predetermined coding rate in said convolutional encoder preceding said interleaving memory.

7. An interleaver according to claim 1, wherein said interleaving memory has $N_W \times N_R/K$ memory locations for storing the K data bits of the encoded data words, wherein $N_W$ denotes the number of columns corresponding to the interleaving depth, K denotes the predetermined number of data bits forming one said data word and $N_R/K$ denotes the number of rows in said interleaving memory.

8. An interleaver according to claim 2, wherein said write/read means comprises a selection means for building code symbols by selecting N respective data bits from $[n_W+(n-1)N_W+n_R N_W \cdot N]$-th positions of the input data bit sequence, where n=1, 2 ... N denotes the n-th data bit of the code symbol, $n_W=0, 1, \ldots N_W-1$ denotes the column address in the interleaving matrix and $n_R=0, 1, \ldots (N_R/K)-1$ denotes the row address in the interleaving mat of the data word resulting from a combining encoding of the code symbol and the additional control bite.

9. An interleaver according to claim 8, wherein said selection means selects data bits for said code symbols from said input data bit sequence and provides said selected code symbol data bits to said combining means and comprises for N=2 data bits per code symbol and even $N_W$:
   two shift register banks each consisting of a first and a second shift register of length $N_W$, wherein the even and odd numbered data bits of said input data bit sequence are respectively stored in said first registers of said first and second shift register bank;
   select/write means for selecting at each write cycle 2 data bits of the least significant bit position and the $N_W/2$ position from the first registers alternately from the first and second register bank and for providing said 2 selected bits as one code symbol to said combining means to be combined with said respective control bits;
   shift means for shifting the register which was read at the last write cycle and the second registers of the register banks while reading in the next odd and even bits of a next input data bit sequence to the respective second register of each register bank; and
   wherein after $N_W$ alternate data bit selecting and shifting cycles the function of the registers is reversed.

10. An interleaver according to claim 8, wherein said selection means selects data bits for said code symbols from said input data bit sequence and provides said selected code symbol data bits to said combining means and comprises for N=2 data bits per code symbol and odd $N_W$:
   two shift register banks each consisting of a first and a second shift register of length $N_W$, wherein the even and odd numbered data bits of said input data bit sequence are respectively stored in said first registers (r0) of said first and second shift register bank;
   select/write means for selecting at each write cycle 2 data bits alternately either from the least significant bit position of the first register of the first bank and from the central position $((N_W-1)/2)$ of the first register of the second bank or from the central position of the first register of the first bank and the least significant bit position of the first register of the second bank, and for writing said 2 selected bits as one code symbol to a respective memory position in said interleaving memory;
   shift means for shifting the two registers which were read at the last write cycle and the registers of the register banks which were not read, while reading in the next odd and even bits of a next input data bit sequence to the respective second register of each register bank; and wherein after $N_W$ alternate data bit selecting and shifting cycles the function of the registers within each bank is reversed.

11. A transmitter for transmitting a data bit sequence of M data bits comprising channel encoded code symbols each consisting of a number N of data bits together with control information associated with every code symbol, the control information to be used to control processing in said transmitter and consisting of a number L of control bits indicating specific states for each corresponding code symbol, comprising:

a0) a channel encoder for receiving digital data in the form of packets from a data source and for encoding said digital data into said channel encoded code symbols of said number N of data bits;

a) combining means for combining the respective N data bits of each channel encoded code symbol with the associated L control bits into a control information/code symbol data word of L+N bits;

b) control information/code symbol encoding means for encoding said L+N control information/code symbol data words into data words of K bits, where K<L+N, according to a predetermined encoding scheme;

c) processing means for processing said code symbols of said encoded data words in accordance with their control information.

12. A transmitter according to claim 11,
said processing means further including a modulation means for modulating said encoded code symbols in accordance to the specific state of the code symbol as indicated by the respective control bits.

13. A method for interleaving in a transmitter input data bit sequence of M data bits comprising channel encoded code symbols each consisting of a number N of data bits together with control information (CI) associated with every code symbol, the control information to be used to control processing in said transmitter and consisting of a number L of control bits indicating specific states for each corresponding code symbol, comprising the following steps:

a0) a channel encoder for receiving digital data in the form of packets from a data source and for encoding said digital data into said channel encoded code symbols of said number N of data bits;

a) combining the respective N data bits of each channel encoded code symbol with the associated L control bits into a control information/code symbol data word of L+N bits;

b) encoding said L+N bit control information/code symbol data words into data words of K bits, where K<L+N, according to a predetermined encoding scheme; and c) storing said encoded data words at memory locations of a memory.

14. A method according to claim 13, further including the following steps:
writing said encoded data words to an interleaving matrix within said interleaving memory at specific memory locations in a row direction and reading out said encoded data words from said interleaving matrix in the column direction and decoding said K bit data words read out from said interleaving matrix in said interleaving memory into said N bit code symbols and said L bit control bits according to an inverse of said predetermined coding scheme.

15. A method according to claim 13, further including the following steps:
processing decoded code symbols in accordance to the specific states of the code symbol as indicated by the respective control bits.

16. A method according to claim 13 wherein
L=4 and N=2, wherein said control bits indicate one or more of a frame start, a time slot start, a marker, and a power bit for the code symbol consisting of said 2 data bits.

17. A method according to claim 13, wherein
one control bit indicates a transmission power ON/OFF control of said code symbols.

18. A method for transmitting in a transmitter a data bit sequence of M data bits comprising channel encoded code symbols each consisting of a number N of data bits together with control information associated with every code symbol, the control information to be used to control processing in said transmitter and consisting of a number L of control bits indicating specific states for each corresponding code symbol, comprising the following steps:

a0) a channel encoder for receiving digital data in the form of packets from a data source and for encoding said digital data into said channel encoded code symbols of said number N of data bits;

a) combining the respective N data bits of each channel encoded code symbol with the associated L control bits into a control information/code symbol data word of L+N bits;

b) encoding said L+N control information/code symbol data words into data words of K bits, where K<L+N, according to a predetermined encoding scheme;

c) processing said code symbols of said encoded data words in accordance with their control information;

d) transmitting said processed code symbols.

19. An encoder of a transmitter for transmitting a data bit sequence of M data bits comprising channel encoded code symbols each consisting of a number N of data bits together with control information associated with every code symbol, the control information to be used to control processing in said transmitter and consisting of a number L of control bits indicating specific states for each corresponding code symbol, comprising:

a0) a channel encoder for receiving digital data in the form of packets from a data source and for encoding said digital data into said channel encoded code symbols of said number N of data bits;

a) combining means for combining the respective N data bits of each channel encoded code symbol with the associated L control bits into a control information/code symbol data word of L+N bits;

b) control information/code symbol encoding means for encoding said L+N bit control information/code symbol data words into data words of K bits, where K<L+N, according to a predetermined encoding scheme;

c) processing means for processing said code symbols of said encoded data words in accordance with their control information.

20. An interleaver of a transmitter for interleaving input data bit sequences of M data bits comprising channel encoded code symbols each consisting of a number N of data bits and control information associated with every code symbol, the control information to be used to control processing in said transmitter and consisting of number L of control bits indicating specific states for each corresponding code symbol comprising:

a0) a channel encoder for receiving digital data in the form of packets from a data source and for encoding said digital data into said channel encoded code symbols of said number N of data bits;

a) combining means for combining the respective N data bits of each channel encoded code symbol with the associated L control bits into a control information/ code symbol data word of L+N bits;

b) control information/code symbol encoding means for encoding said L+N bit control information/code symbol data words into data words of K bits, where K<L+N, according to a predetermined encoding scheme; and c) an interleaving memory for storing said encoded data words at memory locations thereof; and a write/read means for writing said encoded data words to an interleaving matrix within said interleaving memory at specific memory locations in a row direction and for reading out said encoded data words from said interleaving matrix in the column direction and a control information/code symbol decoding means for decoding said K bit data words read out from said interleaving matrix in said interleaving memory into said N bit code symbols and said L bit control bits according to an inverse of said predetermined coding scheme.

21. An interleaver of a transmitter for interleaving input data bit sequences of M data bits comprising channel encoded code symbols each consisting of a number N of data bits and control information associated with every code symbol, the control information to be used to control processing in said transmitter and consisting of a number L of control bits indicating specific states for each corresponding code symbol; comprising:

a0) a channel encoder for receiving digital data in the form of packets from a data source and for encoding said digital data into said channel encoded code symbols of said number N of data bits;

a) combining means for combining the respective N data bits of each channel encoded code symbol with the associated L control bits into a control information/ code symbol data word of L+N bits;

b) control information/code symbol encoding means for encoding said L+N bit control information/code symbol data words into data words of K bits, where K<L+N, according to a predetermined encoding scheme; and c) an interleaving memory for storing said encoded data words at memory locations thereof; and a write/read means for writing said encoded data words to an interleaving matrix within said interleaving memory at specific memory locations in a row direction and for reading out said encoded data words from said interleaving matrix in the column direction and a control information/code symbol decoding means for decoding said K bit data words read out from said interleaving matrix in said interleaving memory into said N bit code symbols and said L bit control bits according to an inverse of said predetermined coding scheme, and each memory location stores one data word respectively consisting of said encoded combination of a predetermined number N of data bits selected from said input data bit sequence by a selection means of said write/ read means and said control bits.

22. An interleaver of a transmitter for interleaving input data bit sequences of M data bits comprising channel encoded code symbols each consisting of a number N of data bits and control information associated with every code symbol, the control information to be used to control processing in said transmitter and consisting of a number L of control bits indicating specific states for each corresponding code symbol; comprising:

a0) a channel encoder for receiving digital data in the form of packets from a data source and for encoding said digital data into said channel encoded code symbols of said number N of data bits;

a) combining means for combining the respective N data bits of each channel encoded code symbol with the associated L control bits into a control information/ code symbol data word of L+N bits, b) control information/code symbol encoding means for encoding said L+N bit control information/code symbol data words into data words of K bits, where K<L+N, according to a predetermined encoding scheme; and c) an interleaving memory for storing said encoded data words at memory locations thereof; and a write/read means for writing said encoded data words to an interleaving matrix within said interleaving memory at specific memory locations in a row direction and for reading out said encoded data words from said interleaving matrix in the column direction and a control information/code symbol decoding means for decoding said K bit data words read out from said interleaving matrix in said interleaving memory into said N bit code symbols and said L bit control bits according to an inverse of said predetermined coding scheme, and said interleaving memory has $N_W \times N_R/K$ memory locations for storing said the K data bits of the encoded data words, wherein $N_W$ denotes the number of columns corresponding to the interleaving depth, K denotes the predetermined number of data bits forming one said data word and $N_R/K$ denotes the number of rows in said interleaving memory; and said write/read means comprises a selection means for building code symbols by selecting N respective data bits from $[n_W+(n-1)N_W+n_R N_W N \cdot]$-th positions of the input data bit sequence, where n=1, 2 ... N denotes the n-th data bit of the code symbol, $n_W=0, 1 \ldots N_W-1$ denotes the column address in the interleaving matrix and $n_R=0, 1 \ldots (N_R/K)-1$ denotes the row address in the interleaving matrix of the data word resulting from a combining encoding of the code symbol and the additional control bits.

23. An interleaver of a transmitter for interleaving input data bit sequences of M data bits comprising channel encoded code symbols each consisting of a number N of data bits and control information associated with every code symbol, the control information to be used to control processing in said transmitter and consisting of a number L of control bits indicating specific states for each corresponding code symbol; comprising:

a) combining means for combining the respective N data bits of each channel encoded code symbol with the associated L control bits into a control information/ code symbol data word of L+N bits, b) control information/code symbol encoding means for encoding said L+N bit control information/code symbol data words into data words of K bits, where K<+N, according to a predetermined encoding scheme; and c) an interleaving memory for storing said encoded data words at memory locations thereof; and a write/read means for writing said encoded data words to an interleaving matrix within said interleaving memory at specific memory locations in a row direction and for reading out said encoded data words from said interleaving matrix in the column direction and a control information/code symbol decoding means for decoding said K bit data words read out from said interleaving matrix in said interleaving memory into said N bit code symbols and said L bit control bits according to an inverse of said predetermined coding scheme, and said interleaving memory has $N_W \times N_R/K$ memory locations for storing said the K data bits of the encoded data words, wherein $N_W$ denotes the number of columns corresponding to the interleaving depth, K denotes the predetermined number of data bits forming one said data word and $N_R/K$ denotes the number of rows in said interleaving memory; and said write/read means comprises a selection means for building code symbols by selecting N respective data bits from $[n_W+(n-1)N_W+n_R N_W N \cdot]$-th positions of the input data bit sequence, where n=1, 2 . . . N denotes the n-th data bit of the code symbol, $n_W$=0, 1 . . . $N_W$–1 denotes the column address in the interleaving matrix and $n_R$=0, 1 . . . ($N_R/K$)–1 denotes the row address in the interleaving matrix of the data word resulting from a combining encoding of the code symbol and the additional control bits; and said selection means selects data bits for said code symbols from said input data bit sequence and provides said selected code symbol data bits to said combining means and comprises for N=2 data bits per code symbol and even $N_W$:

two shift register banks each consisting of a first and a second shift register of length $N_W$, wherein the even and odd numbered data bits of said input data bit sequence are respectively stored in said first registers of said first and second shift register bank;

select/write means for selecting at each write cycle 2 data bits of the least significant bit position and the $N_W/2$ position from the first registers alternately from the first and second register bank and for providing said 2 selected bits as one code symbol to said combining means to be combined with said respective control bits;

shift means for shifting the register which was read at the last write cycle and the second registers of the register banks while reading in the next odd and even bits of a next input data bit sequence to the respective second register of each register bank; and wherein after $N_W$ alternate data bit selecting and shifting cycles the function of the registers is reversed.

24. An interleaver of a transmitter for interleaving input data bit sequences of M data bits comprising channel encoded code symbols each consisting of a number N of data bits and control information associated with every code symbol, the control information to be used to control processing in said transmitter and consisting of a number L of control bits indicating specific states for each corresponding code symbol; comprising:

a) combining means for combining the respective N data bits of each channel encoded code symbol with the associated L control bits into a control information/code symbol data word of L+N bits, b) control information/code symbol encoding means for encoding said L+N bit control information/code symbol data words into data words of K bits, where K<L+N, according to a predetermined encoding scheme; and c) an interleaving memory for storing said encoded data words at memory locations thereof; and a write/read means for writing said encoded data words to an interleaving matrix within said interleaving memory at specific memory locations in a row direction and for reading out said encoded data words from said interleaving matrix in the column direction and a control information/code symbol decoding means for decoding said K bit data words read out from said interleaving matrix in said interleaving memory into said N bit code symbols and said L bit control bits according to an inverse of said predetermined coding scheme, and said interleaving memory has $N_W \times N_R/K$ memory locations for storing said the K data bits of the encoded data words, wherein $N_W$ denotes the number of columns corresponding to the interleaving depth, K denotes the predetermined number of data bits forming one said data word and $N_R/K$ denotes the number of rows in said interleaving memory; and said write/read means comprises a selection means for building code symbols by selecting N respective data bits from $[n_W+(n-1)N_W+n_R N_W N \cdot]$-th positions of the input data bit sequence, where n=1, 2 . . . N denotes the n-th data bit of the code symbol, $n_W$=0, 1 . . . $N_W$–1 denotes the column address in the interleaving matrix and $n_R$=0, 1 . . . ($N_R/K$)–1 denotes the row address in the interleaving matrix of the data word resulting from a combining encoding of the code symbol and the additional control bits; and said selection means selects data bits for said code symbols from said input data bit sequence and provides said selected code symbol data bits to said combining means and comprises for N=2 data bits per code symbol and even $N_W$:

two shift register banks each consisting of a first and a second shift register of length $N_W$, wherein the even and odd numbered data bits of said input data bit sequence are respectively stored in said first registers of said first and second shift register bank;

select/write means for selecting at each write cycle 2 data bits alternatively either from the least significant bit position of the first register of the first bank and from the central position (($N_W$–1)/2) of the first register of the second bank or from the central position of the first register of the first bank and the least significant bit position of the first register of the second bank, and for writing said 2 selected bits as one code symbol to a respective memory position in said interleaving memory;

shift means for shifting the two registers which were read at the last write cycle and the registers of the register banks which were not read, while reading in the next odd and even bits of a next input data bit sequence to the respective second register of each register bank; and wherein after $N_W$ alternate data bit selecting and shifting cycles the function of the registers is reversed.

25. An interleaver of a transmitter for interleaving input data bit sequences of M data bits comprising channel encoded code symbols each consisting of a number N data bits and control information associated with every code symbol, the control information to be used to control processing in said transmitter and consisting of a number L of control bits indicating specific states for each corresponding code symbol; comprising:

a channel encoder for receiving digital data in the form of packets from a data source and for encoding said digital data into said channel encoded code symbols of said number N of data bits a combiner which combines the respective N data bits of each channel encoded code symbol with the associated L control bits into a control information/code symbol data word of L+N bits;

an encoder which encodes said L+N bit control information/code symbol data words into data words of K bits, where K<L+N, according to a predetermined encoding scheme;

an interleaving memory for storing said encoded data words at memory locations thereof; and a decoder which derives the control information from the data words;

a radio frequency transmitter element whose operation is controlled by the control information derived from the decoder.

26. An interleaver according to claim 25, further including a write/read means for writing said encoded data words to an interleaving matrix within said interleaving memory at specific memory locations in a row direction and for reading out said encoded data words from said interleaving matrix in the column direction and a control information/code symbol decoding means for decoding said K bit data words read out from said interleaving matrix in said interleaving memory into said N bit code symbols and said L bit control bits according to an inverse of said predetermined coding scheme.

27. An interleaver according to claim 25, wherein L=4 and N=2, wherein said control bits indicate one or more of a frame start, a time slot start, a marker, and a power bit for the code symbol consisting of said 2 data bits.

28. An interleaver according to claim 25, wherein one control bit indicates a transmission power ON/OFF control of said code symbols.

29. An interleaver according to claim 26, wherein each memory location stores one data word respectively consisting of said encoded combination of a predetermined number N of data bits selected from said input data bit sequence by a selector of said write/read means and said control bits.

30. An interleaver according to claim 25, wherein said input data bit sequence of M data bits consists of data bit sets each including a predetermined number of bits resulting from a convolutional encoding of a respective data bit using a predetermined coding rate in a convolutional encoder preceding said interleaving memory.

31. An interleaver according to claim 25, wherein said interleaving memory has $N_W \times N_R/K$ memory locations for storing the K data bits of the encoded data words, wherein $N_W$ denotes the number of columns corresponding to the interleaving depth, K denotes the predetermined number of data bits forming one said data word and $N_R/K$ denotes the number of rows in said interleaving memory.

32. An interleaver according to claim 25, wherein the radio frequency transmitter element whose operation is controlled by the control information derived from the decoder is a modulator.

33. A radio frequency transmitter comprising:

a channel encoder for receiving digital data in the form of packets from a data source and for encoding said digital data into said channel encoded code symbols;

a combiner which combines the channel encoded code symbol with the transmitter control information into a control information/code symbol data word;

an encoder which encodes the control information/code symbol data word;

an interleaving memory for storing said encoded data word at memory locations thereof;

a decoder which derives the control information from the data words;

a radio frequency transmitter element whose operation is controlled by the control information derived from the decoder, wherein the combiner combines respective N data bits of each channel encoded code symbol with associated L control bits into a control information/code symbol data word of L+N bits; and wherein the encoder positioned between the combiner and the interleaving memory, encodes the L+N bit control information/code symbol data words into data words of K bits, where K<L+ N.

34. An interleaver according to claim 33, wherein the radio frequency transmitter element whose operation is controlled by the control information derived from the decoder is a modulator.

* * * * *